(12) United States Patent
Shim et al.

(10) Patent No.: US 12,419,165 B2
(45) Date of Patent: Sep. 16, 2025

(54) DISPLAY APPARATUS

(71) Applicant: SAMSUNG DISPLAY CO., LTD., Yongin-si (KR)

(72) Inventors: Donghwan Shim, Yongin-si (KR); Seunghwan Cho, Yongin-si (KR); Jonghyun Choi, Yongin-si (KR); Minjoo Kim, Yongin-si (KR); Sunho Kim, Yongin-si (KR); Hoongi Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 442 days.

(21) Appl. No.: 18/062,012

(22) Filed: Dec. 5, 2022

(65) Prior Publication Data
US 2023/0103171 A1    Mar. 30, 2023

Related U.S. Application Data

(63) Continuation of application No. 16/935,657, filed on Jul. 22, 2020, now Pat. No. 11,522,036.

(30) Foreign Application Priority Data

Sep. 2, 2019   (KR) .................. 10-2019-0108460

(51) Int. Cl.
*H10K 59/131*   (2023.01)
*G06F 3/044*    (2006.01)
*H10K 59/40*    (2023.01)

(52) U.S. Cl.
CPC ......... *H10K 59/131* (2023.02); *G06F 3/0446* (2019.05); *H10K 59/40* (2023.02)

(58) Field of Classification Search
CPC .... H10K 59/131; H10K 59/40; H10K 59/126; H10K 59/353; H10K 59/35; H10K 50/80;
(Continued)

(56) References Cited

U.S. PATENT DOCUMENTS 6,091,196 A     7/2000  Codama
2012/0097426 A1  4/2012  Seo et al.
(Continued)

FOREIGN PATENT DOCUMENTS

CN   102709273 A   10/2012
CN   106486522 A    3/2017
(Continued)

*Primary Examiner* — Elmito Breval
(74) *Attorney, Agent, or Firm* — Womble Bond Dickinson (US) LLP

(57) ABSTRACT

A display apparatus includes a plurality of data lines in a display area, a plurality of display elements in the display area and connected to the plurality of data lines, and a plurality of wirings in the display area and connected to the plurality of data lines, the plurality of wirings being configured to transfer data signals from a driving circuit to the plurality of data lines, the driving circuit being located in a peripheral area outside the display area, each of the plurality of wirings including a plurality of branches protruding from corresponding ones of the wirings in a direction perpendicular to an extension direction of the corresponding ones of the wirings, and end portions of each of the plurality of branches having an oblique shape inclined from the extension direction of the wiring in a plan view.

12 Claims, 29 Drawing Sheets

(58) Field of Classification Search
CPC .. G06F 3/0446; G09G 3/3208; H10D 86/443; H10D 86/60
See application file for complete search history.

(56) References Cited

U.S. PATENT DOCUMENTS

| | | |
|---|---|---|
| 2015/0370138 A1 | 12/2015 | Lee et al. |
| 2017/0062545 A1 | 3/2017 | Oh et al. |
| 2017/0205934 A1 | 7/2017 | Lee et al. |
| 2018/0026225 A1 | 1/2018 | Kwon et al. |
| 2018/0097039 A1 | 4/2018 | Jeong et al. |
| 2018/0150170 A1 | 5/2018 | Oh et al. |
| 2018/0151653 A1 | 5/2018 | Lee et al. |

FOREIGN PATENT DOCUMENTS

| | | |
|---|---|---|
| CN | 107658386 A | 2/2018 |
| JP | 2006-351553 A | 12/2006 |
| KR | 10-2011-0100102 A | 9/2011 |
| KR | 10-2015-0146389 A | 12/2015 |
| KR | 10-2018-0036431 A | 4/2018 |
| KR | 10-2018-0062292 A | 6/2018 |
| KR | 10-2019-0025587 A | 3/2019 | even # DISPLAY APPARATUS

CROSS-REFERENCE TO RELATED APPLICATIONS

This application is a continuation of U.S. patent application Ser. No. 16/935,657, filed Jul. 22, 2020, which claims priority to and the benefit of Korean Patent Application No. 10-2019-0108460, filed Sep. 2, 2019, the entire content of both of which is incorporated herein by reference.

BACKGROUND

1. Field

One or more embodiments relate to a display apparatus.

2. Description of Related Art

As displays representing various electrical signal information have been rapidly developed, various display apparatuses having excellent characteristics such as a small thickness, a light weight, and low power consumption have been introduced. Also, recently, dead areas (e.g., non-display areas such as bezel areas) of display apparatuses have decreased and sizes of display areas have increased.

SUMMARY

One or more embodiments include a display apparatus, in which a dead area is reduced and a pattern (e.g., visual artifact) is reduced or prevented from being visible in a display area.

Technical problems to be solved by the present disclosure are not limited to the above-described technical problems and one of ordinary skill in the art will understand other technical problems from the following description.

Additional aspects will be set forth in part in the description which follows and, in part, will be apparent from the description, or may be learned by practice of the presented embodiments of the disclosure.

According to one or more embodiments, a display apparatus includes a plurality of data lines in a display area, a plurality of display elements in the display area and connected to the plurality of data lines, and a plurality of wirings in the display area and connected to the plurality of data lines, the plurality of wirings being configured to transfer data signals from a driving circuit to the plurality of data lines, the driving circuit being located in a peripheral area outside the display area. Each of the plurality of wirings includes a plurality of branches protruding from corresponding ones of the wirings in a direction perpendicular to an extension direction of the corresponding ones of the wirings, and end portions of each of the plurality of branches having an oblique shape inclined from the extension direction of the wiring in a plan view.

The end portions of the plurality of branches may be inclined in a same direction.

The end portions of the plurality of branches may include a first plurality of end portions inclined in a first oblique direction and a second plurality of end portions inclined in a second oblique direction different from the first oblique direction, and positions of the first plurality of end portions inclined in the first oblique direction and positions of the second plurality of end portions inclined in the second oblique direction may have a periodicity.

The wirings may extend in directions that are parallel with one another and may be spaced apart from one another, end portions of one pair of branches extending in a same line protruding toward each other from two adjacent wirings from among the plurality of wirings are spaced apart from each other.

The display apparatus may further include a plurality of sensing electrodes on the plurality of wirings.

Each of the plurality of sensing electrodes may include a grid line, the grid line overlaps end portions of branches of the plurality of wirings, and the branches include a plurality of pairs of branches, each of the pairs including two branches extending in a same line and protruding toward each other from two adjacent wirings, the end portions of the two branches facing each other and being spaced apart from each other.

A width of the grid line may be greater than a width of a gap between the end portions of the pairs of branches overlapped with the grid line.

An extension direction of the grid line and a direction in which the end portions of the branches overlapping the grid line are inclined may be the same.

The plurality of wirings may be located at different layers from the plurality of data lines.

The plurality of wirings may include a first portion and a third portion extending in an extension direction of the plurality of data lines and a second portion extending in a direction intersecting with the extension direction of the plurality of data lines, the second portion being located between the first portion and the third portion.

Each of the plurality of wirings may include first branches protruding from the first portion and the third portion and second branches protruding from the second portion.

The display apparatus may further include a connection line located in a peripheral area outside the display area and configured to connect the plurality of wirings to the driving circuit located in the peripheral area.

According to one or more embodiments, a display apparatus includes a plurality of data lines located in a display area, a plurality of display elements located in the display area and connected to the plurality of data lines, a plurality of wirings located in the display area and connected to the plurality of data lines, and a sensing electrode on the plurality of wirings. Each of the plurality of wirings includes a plurality of branches protruding from corresponding ones of the wirings in a direction perpendicular to an extension direction of the corresponding ones of the wirings, the branches including a plurality of pairs of branches, each of the pairs including two branches extending in a same line and protruding toward each other from two adjacent wirings, and the sensing electrode may overlap end portions of the branches of the plurality of wirings, the end portions of the two branches of each of the pairs of branches facing each other and being spaced apart from each other.

An end portion of each of the plurality of branches may have an oblique shape inclined from the extension direction of the corresponding ones of the wirings in a plan view.

The sensing electrode may include a grid line, wherein the grid line overlaps the end portions of the branches of the plurality of wirings.

A width of the grid line may be greater than a width of a gap between the end portions of the pairs of branches overlapped with the grid line.

An extension direction of the grid line and a direction in which the end portions of the branches overlapped with the grid line are inclined may be the same.

The grid line may include a portion extending in a first direction and a portion extending in a second direction that intersects with the first direction, wherein positions of branches overlapped with the portion of the grid line extending in the first direction and positions of branches overlapped with the portion of the grid line extending in the second direction have a periodicity.

The plurality of wirings may include a first portion and a third portion extending in an extension direction of the plurality of data lines and a second portion extending in a direction intersecting with the extension direction of the plurality of data lines, the second portion being located between the first portion and the third portion.

Each of the plurality of wirings may include first branches protruding from the first portion and the third portion and second branches protruding from the second portion.

The end portions of each of the plurality of branches may protrude in oblique direction of the extension direction of the corresponding ones of the wirings.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
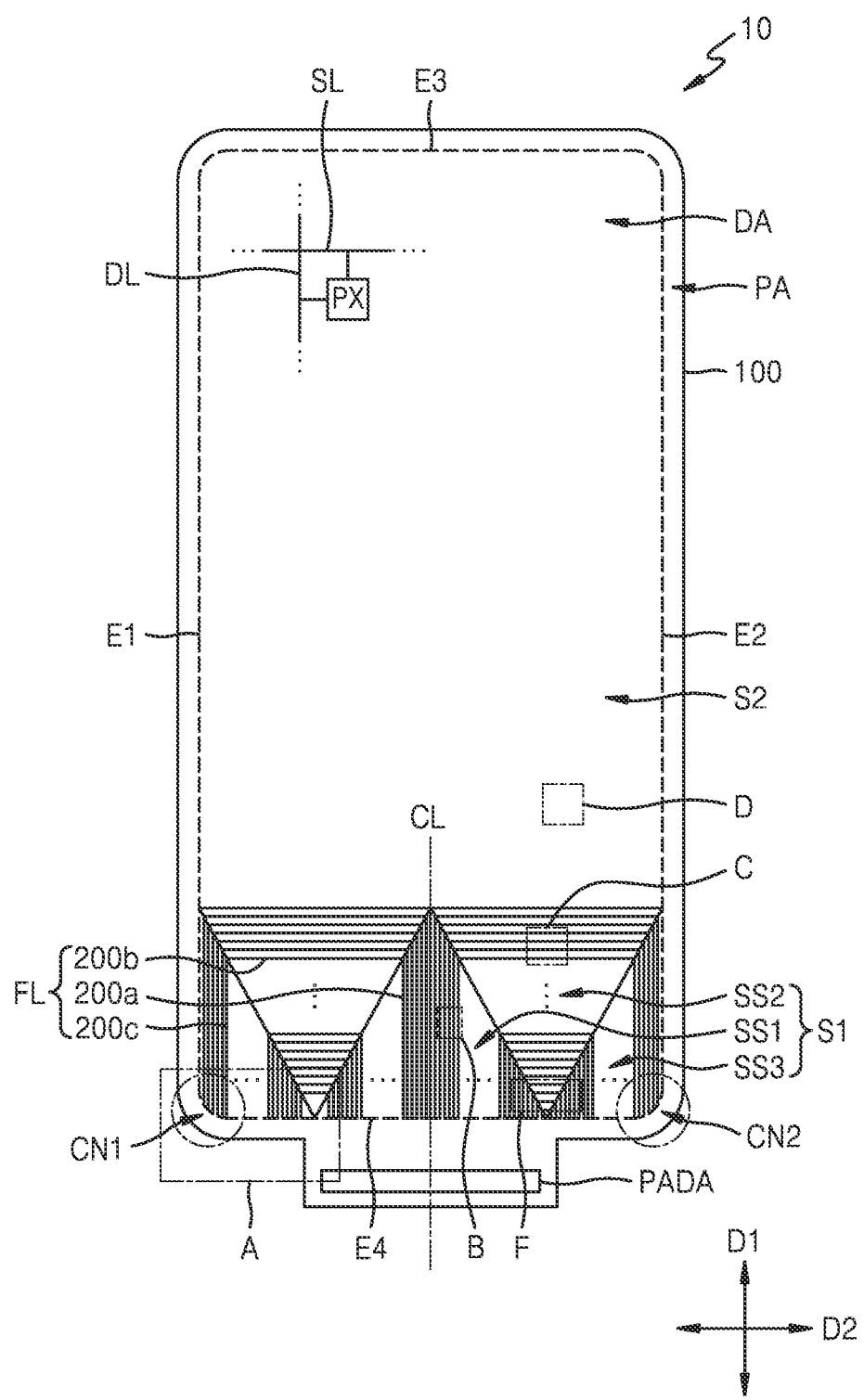
FIG. 1 is a plan view illustrating a display panel according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on," another layer, region, or element, it may be directly or indirectly formed on the other layer, region, or element. That is, for example, intervening layers, regions, or elements may be present.

Sizes of elements may be exaggerated for convenience of explanation. In other words, because sizes and thicknesses of elements in the drawings are arbitrarily illustrated for convenience of explanation, the following embodiments are not limited thereto.

The expression "A and/or B" indicates only A, only B, or both A and B. Also, the expression "at least one of A and B" includes only A, only B, or both A and B.

In the following embodiments, when a wiring "extends in a first direction or a second direction," it may mean that the wiring extends not only in a linear shape but also in a zigzag or curved shape in the first direction or the second direction.

In the following embodiments, "a plan view of an object" refers to "a view of an object seen from above" or "a view from a direction normal to a major surface of the object," and "a cross-sectional view of an object" refers to "a view of an object vertically cut and seen from the side." In the following embodiments, when elements "overlap," it may mean that the elements overlap in a "plan view" and a "cross-sectional view".

Hereinafter, the present disclosure will be described more fully with reference to the accompanying drawings, in which embodiments of the disclosure are shown, and in the drawings, the same or corresponding elements are denoted by the same reference numerals.

Figure 2:
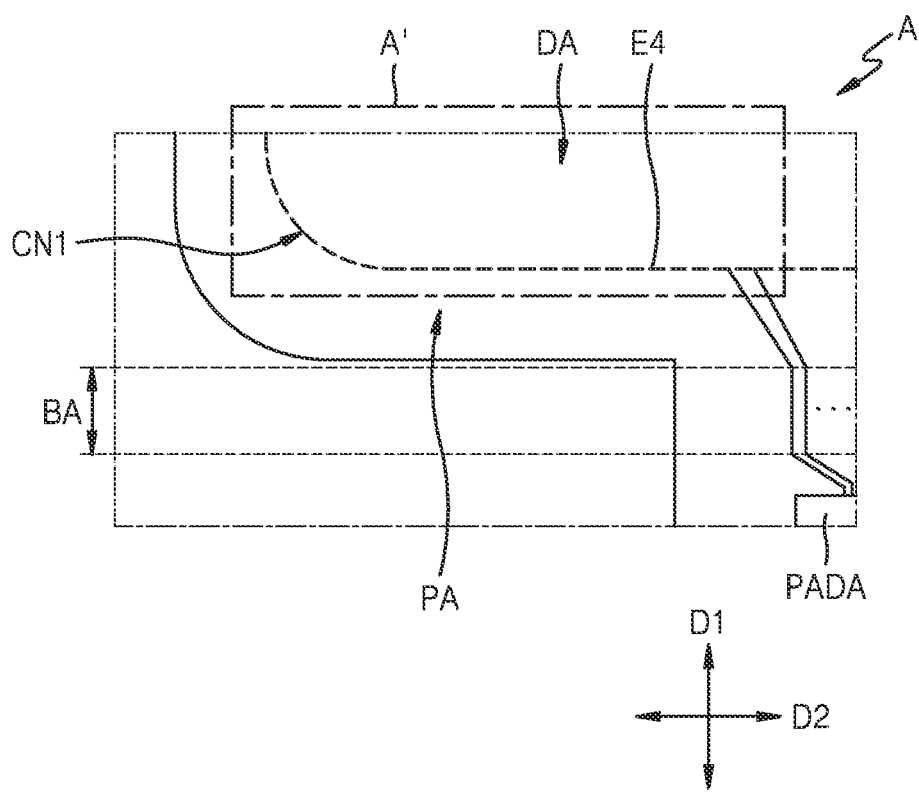
FIG. 2 is a conceptual view illustrating a portion A of FIG. 1.
Figure 3:
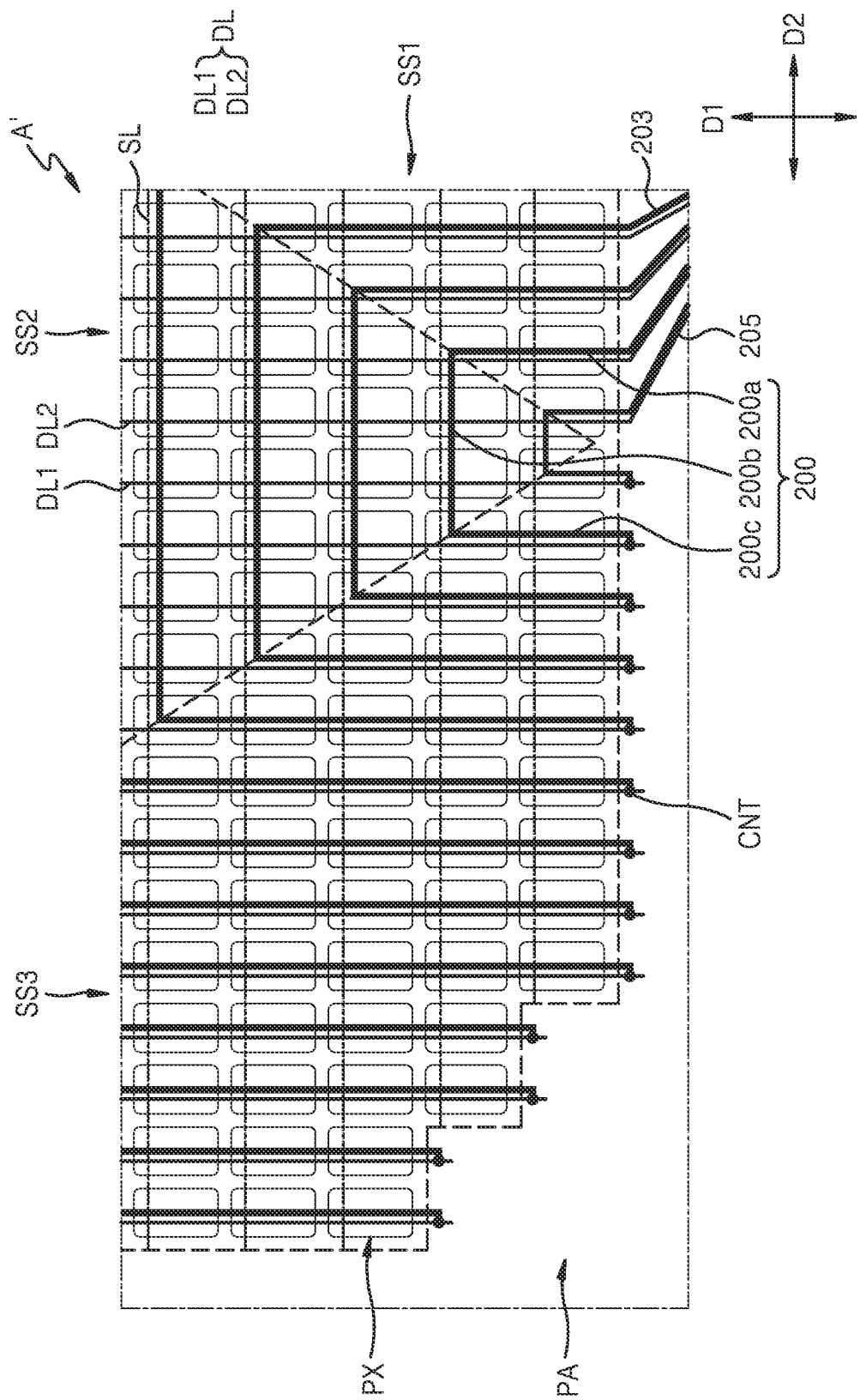
FIG. 3 is a partial enlarged plan view illustrating a portion A' of FIG. 2.

FIG. 1 is a plan view illustrating a display panel according to an embodiment. FIG. 2 is a conceptual view illustrating a region A of FIG. 1, and FIG. 3 is a partial enlarged plan view illustrating a region A' of FIG. 2.

Referring to FIG. 1, a display apparatus according to an embodiment may include a display panel 10 including a substrate 100. The display panel 10 may have a display area DA and a peripheral area PA located outside the display area DA. The substrate 100 may have a display area DA and a peripheral area PA respectively corresponding to the display area DA and the peripheral area PA of the display panel 10.

An edge of the display area DA may have a shape similar to a rectangular shape or a square shape. As shown in FIGS.

1 and 2, a first corner CN1 of an edge of the display area DA may have a round shape. In detail, the display area DA may include a first edge E1 and a second edge E2 facing each other, and a third edge E3 and a fourth edge E4 located between the first edge E1 and the second edge E2 and facing each other (e.g., as shown in FIG. 1, the third edge E3 and the fourth edge E4 may be perpendicular to the first edge E1 and the second edge E2). A pad area PADA is adjacent to the fourth edge E4 from among the first edge E1, second edge E2, third edge E3, and the fourth edge E4. In this case, the first corner CN1 having a round shape connects the first edge E1 to the fourth edge E4. A second corner CN2 of the edge of the display area DA may also have a round shape, like the first corner CN1. The second corner CN2 connects the second edge E2 to the fourth edge E4. Also, other portions of the edge of the display area DA (e.g., a corner between first edge E1 and third edge E3 and a corner between second edge E2 and third edge E3) may have a round shape. While the first and second edges E1 and E2 are longer than the third and fourth edges E3 and E4 in FIG. 1, in other embodiments, third and fourth edges may each be longer than first and second edges.

The peripheral area PA may surround the display area DA. The peripheral area PA, where pixels PX are not located, may include the pad area PADA to which various electronic devices or a printed circuit board are electrically attached, and a voltage line for supplying power for driving a display element may be located in the peripheral area PA. A plurality of pads may be provided in the pad area PADA and may be electrically connected to a data driver. In an embodiment, the data driver that applies a data signal may be located on a film electrically connected to the pads of the pad area PADA by using a chip-on-film (COF) method. In another embodiment, the data driver may be directly located on the substrate 100 by using a chip-on-glass (COG) method or a chip-on-plastic (COP) method.

FIG. 1 is a plan view illustrating a state of the substrate 100 during a process of manufacturing the display apparatus. In order to reduce a size of the peripheral area PA recognized by a user (e.g., visible to the user) in the final display apparatus or an electronic device such as a smartphone including the display apparatus, a part of the substrate 100 may be bent.

As shown in FIG. 2, the peripheral area PA may include a bending area BA, and the bending area BA may be located between the pad area PADA and the display area DA. In this case, the substrate 100 may be bent in the bending area BA, and at least a part of the pad area PADA may overlap the display area DA when the substrate 100 is in a bent state. A bending direction is set so that the pad area PADA does not cover the display area DA and is located behind the display area DA. Accordingly, the user recognizes that the display area DA occupies the majority of the display apparatus in plan view.

FIG. 3 illustrates a part of the first corner CN1. When the user observes the display apparatus according to the present embodiment or the electronic device including the display apparatus in a normal use environment, the user recognizes that the display apparatus or the electronic device has a round shape, that is, a curved shape. However, in an environment where the first corner CN1 is enlarged (e.g., under magnification) and thus wirings having a width of several or tens of micrometers may be observed (e.g., are made visible due to the magnification), as shown in FIG. 3, the first corner CN1 may have a linear shape bent multiple times in a first direction D1 and a second direction D2 (e.g., a stepped shape along the first direction D1 and the second direction D2). However, although the first corner CN1 has a linear shape bent multiple times when enlarged as shown in FIG. 3, the user may recognize, in a normal use environment, that the first corner CN1 has a substantially round shape, that is, a curved shape. Accordingly, when each of the first corner CN1 and the second corner CN2 is described herein as having a round shape, the term includes both a case where each of the first corner CN1 and the second corner CN2 has a substantially round shape and a case where each of the first corner CN1 and the second corner CN2 has a linear shape bent multiple times (e.g., a stepped shape).

The plurality of pixels PX and signal lines for applying an electrical signal to the plurality of pixels PX may be located in the display area DA.

Each of the plurality of pixels PX may include a display element and a pixel circuit for driving the display element. For example, the display element may be an organic light-emitting diode, and the pixel circuit may include a plurality of transistors and a capacitor. The plurality of pixels PX may include first pixels that emit light of a first color, second pixels that emit light of a second color, and third pixels that emit light of a third color. For example, the first pixels may be red pixels R (e.g., may be configured to emit red light), the second pixels may be green pixels G (e.g., may be configured to emit green light), and the third pixels may be blue pixels B (e.g., may be configured to emit blue light).

The signal lines for applying electrical signals to the plurality of pixels PX may include a plurality of scan lines SL, a plurality of data lines DL, etc. The plurality of data lines DL may extend in the first direction D1, and the plurality of scan lines SL may extend in the second direction D2. The plurality of scan lines SL may be arranged in a plurality of rows and may transfer scan signals to the pixels PX (e.g., each scan line of the scan lines SL may transfer scan signals to a corresponding row of the pixels PX), and the plurality of data lines DL may be arranged in a plurality of columns along the second direction D2 and may transfer data signals to the pixels PX (e.g., each data line of the data lines DL may transfer data signals to a corresponding column of the pixels PX). Each of the plurality of pixels PX may be connected to at least one corresponding scan line SL from among the plurality of scan lines SL and a corresponding data line DL from among the plurality of data lines DL. The data lines DL may include first data lines DL1 and second data lines DL2 as shown in FIG. 3. The first data lines DL1 may be data lines connected to first wirings 200 which will be described below. The second data lines DL2 may be data lines other than the first data lines DL1.

The first wirings 200 for transferring an electrical signal applied from the pad area PADA to the signal lines connected to the pixels PX may be located in the display area DA. For example, the first wirings 200 may be connected to the first data lines DL1 and may transfer data signals applied from the pads of the pad area PADA to the first data lines DL1. The scan lines SL, the data lines DL, the pixels PX, the first wirings 200, and various other electronic components such as transistors and capacitors of the display panel 10 may be located or formed at various layers on the substrate 100, and first wirings 200 may be located at layers different from the scan lines SL and the data lines DL of the pixels PX.

A virtual central line CL substantially passes through the center of the display panel 10 perpendicularly to the second direction D2 (e.g., in parallel with the first direction D1) and portions of the first wirings 200 arranged on the left and the right of the central line CL may be substantially symmetric to each other about the central line CL (e.g., the first wirings 200 may be arranged substantially symmetrically on the two sides of the virtual central line CL).

Each of the first wirings 200 may include a first portion 200a and a third portion 200c, both extending in the first direction D1, and a second portion 200b extending in the second direction D2 crossing the first direction D1 (FIG. 3 labels only one of the first wirings 200 and its corresponding first portion 200a, second portion 200b, and third portion 200c). The second portion 200b may connect the first portion 200a to the third portion 200c. The first portion 200a, the second portion 200b, and the third portion 200c may be integrally formed with one another. The first portion 200a may be located close to the virtual central line CL, and the third portion 200c may be located close to the first and second corners CN1 and CN2. The first portion 200a may extend in the first direction D1 from the fourth edge E4 facing the pad area PADA. The second portion 200b may be bent at (or bent from) the first portion 200a and may extend in the second direction D2, crossing the first direction D1, toward the first edge E1 or toward the second edge E2. The third portion 200c may be bent at (or bent from) the second portion 200b and may extend in the first direction D1 toward the fourth edge E4.

The display area DA may be divided into a plurality of areas according to whether the first wirings 200 are located therein. For example, the display area DA may include a first area S1 where the first wirings 200 are located and a second area S2 other than the first area S1. The second area S2 may be an area where the first wirings 200 are not located (e.g., the second area S2 may be an area that is absent the first wirings 200).

The first area S1 may be divided into a plurality of sub-areas in accordance with an extension direction of the first wirings 200. For example, the first portion S1 may include a first sub-area SS1 where the first portions 200a of the first wirings 200 are located, a second sub-area SS2 where the second portions 200b are located, and a third sub-area SS3 where the third portions 200c are located. The first sub-area SS1, the second sub-area SS2, and the third sub-area SS3 located on the right of the virtual central line CL and the first sub-area SS1, the second sub-area SS2, and the third sub-area SS3 located on the left of the virtual central line CL may be substantially symmetric to each other.

Referring to FIG. 3, the first portion 200a of each of the first wirings 200 may be parallel to the second data line DL2, and may be located partially overlapping or adjacent to the second data line DL2. The first portion 200a of each of the first wirings 200 may extend in a direction parallel to the second data line DL2 (e.g., extending in the first direction D1) located in one of a plurality of columns. The second portion 200b of each of the first wirings 200 may be parallel to the scan line SL (e.g., extending in the second direction D2) and may be located partially overlapping or adjacent to the scan line SL. The second portion 200b of each of the first wirings 200 may extend parallel to the scan line SL located in one of a plurality of rows. The third portion 200c of each of the first wirings 200 may be parallel to the first data line DL1 (e.g., along the first direction D1) and may be located partially overlapping or adjacent to the first data line DL1. The third portion 200c of each of the first wirings 200 may extend in parallel to the first data line DL1 located in one of a plurality of columns.

A column in which the first portion 200a of each of the first wirings 200 is located and a column in which the third portion 200c of each of the first wirings 200 is located may be spaced apart from each other by at least one column interval (e.g., a distance between two adjacent ones of the data lines DL, as shown in FIG. 3). The first portions 200a of one pair of adjacent first wirings 200 may be spaced apart from each other by at least one column interval. The third portions 200c of one pair of adjacent first wirings 200 may be spaced apart from each other by at least one column interval. The second portions 200b of one pair of adjacent first wirings 200 may be spaced apart from each other by at least one row interval (e.g., a distance between two adjacent ones of the scan lines SL, as shown in FIG. 3).

As shown in FIG. 3, second wirings 203 and third wirings 205 may be further located in the peripheral area PA.

One end of each of the first wirings 200 may be connected to a corresponding one of the first data lines DL1, and the other end of each of the first wirings 200 may be connected to the second wiring 203. One end of each of the second wirings 203 may be connected to the other end of a corresponding one of the first wirings 200, and the other end of each of the second wirings 203 may be connected to corresponding ones of the pads of the pad area PADA (FIG. 3 labels only one of the second wirings 203). In an embodiment, the second wiring 203 may be a portion of the first portion 200a of the first wiring 200 that extends to the peripheral area PA. In another embodiment, the second wiring 203 is a separate wiring located at a layer different from the first wiring 200 that may be electrically connected to the first portion 200a of the first wiring 200 in the peripheral area PA. The third portions 200c of the first wirings 200 may be electrically connected to corresponding ones of the first data lines DL1 at corresponding contact portions CNT of the peripheral area PA (while FIG. 3 labels only one of the first data lines DL1, one of the first wirings 200, and one of the contact portions CNT, each of the first data lines DL1 is connected to corresponding one of the first wirings 200 at a corresponding contact portion CNT).

One end of each of the third wirings 205 may be connected to corresponding ones of the second data lines DL2, and the other end of each of the third wirings 205 may be connected to corresponding ones of the pads of the pad area PADA (FIG. 3 labels only one of the third wirings 205). In an embodiment, each of the third wirings 205 may be a portion of a corresponding one of the second data lines DL2 that extends to the peripheral area PA. In another embodiment, each of the third wirings 205 is a separate wiring located at a layer different from the corresponding one of the second data lines DL2, and may be electrically connected to the corresponding one of the second data lines DL2 in the peripheral area PA (while FIG. 3 labels only one of the second data lines DL1 and one of the third wirings 205, each of the second data lines DL2 is connected to corresponding one of the third wirings 205).

Figure 4A:
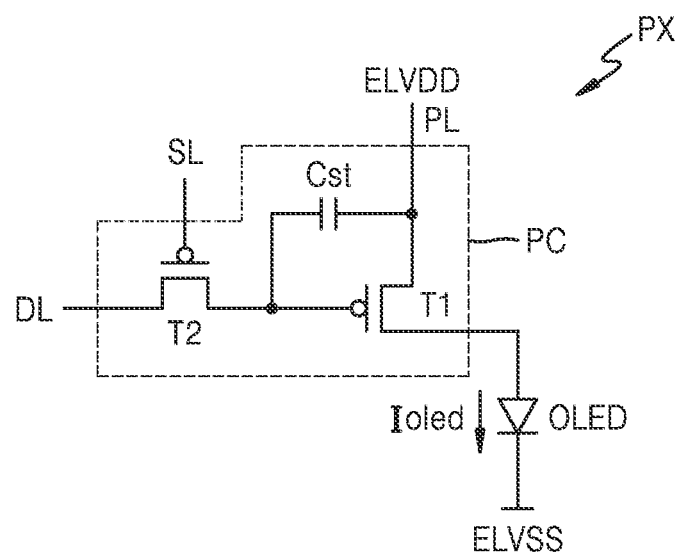
FIGS. 4A and 4B are equivalent circuit diagrams illustrating one pixel located in a display panel according to an embodiment.
Figure 4B:
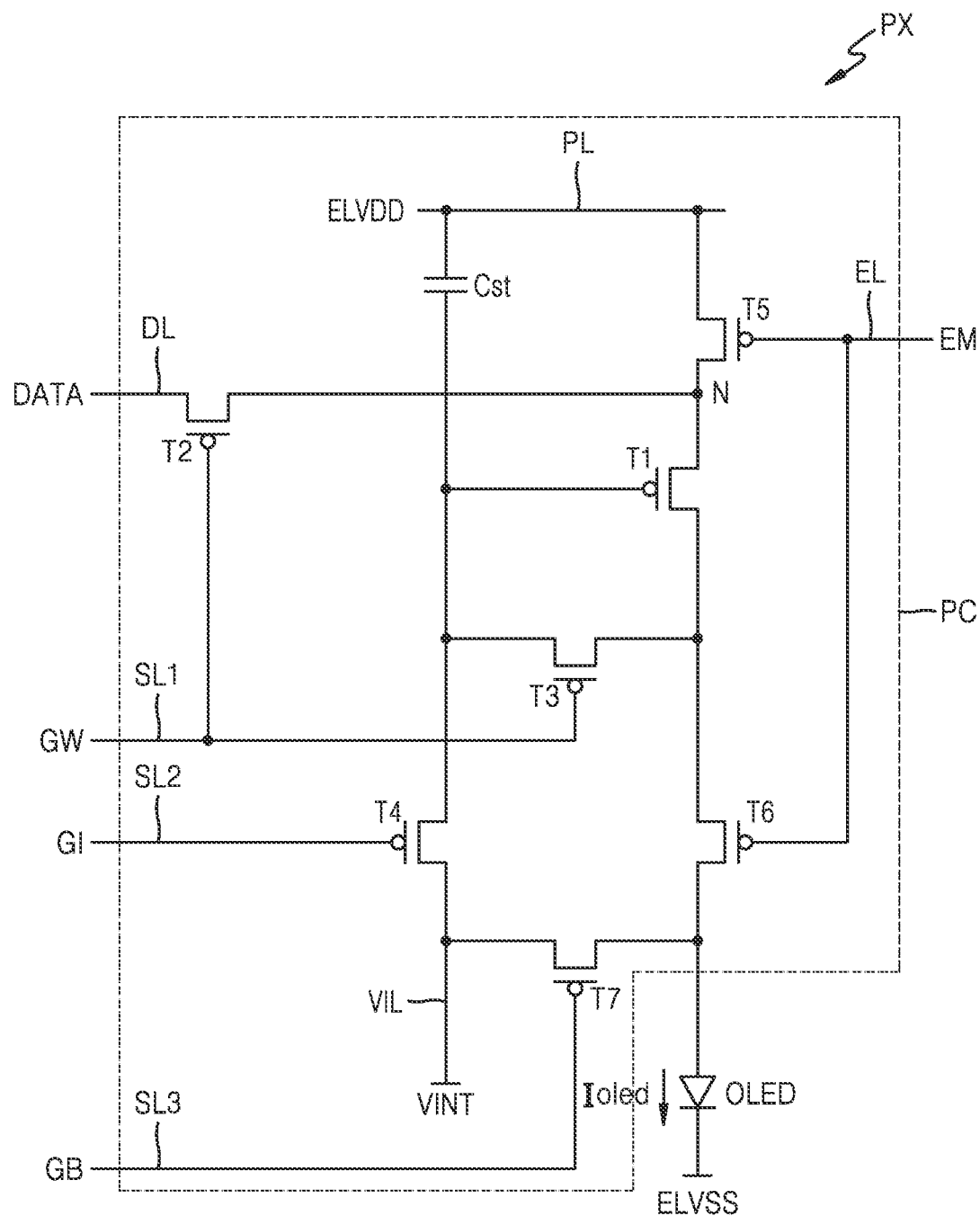

FIGS. 4A and 4B are equivalent circuit diagrams illustrating one pixel located in a display panel according to an embodiment.

Referring to FIG. 4A, the pixel PX includes a pixel circuit PC and an organic light-emitting diode OLED that is a display element connected to the pixel circuit PC. The pixel circuit PC may include a first transistor T1, a second transistor T2, and a capacitor Cst. Each pixel PX may emit, for example, red, green, blue, or white light from the organic light-emitting diode OLED. The first transistor T1 and the second transistor T2 may include thin-film transistors.

The second transistor T2 that is a switching transistor may be connected to the scan line SL and the data line DL and may transfer a data signal input from the data line DL to the first transistor T1 according to a switching voltage input from the scan line SL. The capacitor Cst may be connected to the second transistor T2 and a power voltage line PL and may store a voltage corresponding to a difference between a voltage corresponding to a data signal received from the second transistor T2 and a first power voltage ELVDD supplied to the power voltage line PL. The power voltage line PL may be spaced apart from the scan line SL or the data line DL to be parallel to the scan line SL or parallel to the data line DL.

The first transistor T1 that is a driving transistor may be connected to the power voltage line PL and the capacitor Cst and may control driving current flowing through the organic light-emitting diode OLED from the power voltage line PL in response to (or in accordance with) a value of a voltage stored in the capacitor Cst. The organic light-emitting diode OLED may include a pixel electrode and a counter electrode, and the counter electrode may receive a second power voltage ELVSS. The organic light-emitting diode OLED receives driving current Ioled from the first transistor T1 and emits light in accordance with the driving current Ioled to display an image (e.g., in conjunction with other pixels PX of in the display area).

In FIG. 4A, the pixel circuit PC includes two transistors and one capacitor. In another embodiment, the number of transistors and the number of capacitors may be modified in various suitable ways according to a design of the pixel circuit PC.

Referring to FIG. 4B, each pixel PX includes signal lines (e.g., a first scan line SL1, a second scan line SL2, a third scan line SL3, an emission control line EL, and the data line DL), an initialization voltage line VIL, and the power voltage line PL. In another embodiment, at least one of the signal lines (e.g., the first scan line SL1, the second scan line SL2, the third scan line SL3, the emission control line EL, and the data line DL), the initialization voltage line VIL, and/or the power voltage line PL may be shared by neighboring pixels.

The signal lines include the first scan line SL1 that transfers a first scan signal GW, the second scan line SL2 that transfers a second scan signal GI, the third scan line SL3 that transfers a third scan signal GB, the emission control line EL that transfers an emission control signal EM, and the data line DL that transfers a data signal DATA. The third scan line SL3 may be the second scan line SL2 of a next row, and the third scan signal GB may be a second scan signal GI of the next row.

The power voltage line PL transfers the first power voltage ELVDD to the first transistor T1, and the initialization voltage line VIL transfers, to the pixel PX, an initialization voltage VINT for initializing a gate electrode (gate terminal) of the first transistor T1 and a pixel electrode (anode) of the organic light-emitting diode OLED.

The first scan line SL1, the scan line SL2, the third scan line SL3, the emission control line EL, and the initialization voltage line VIL may extend in the second direction D2 and may be spaced apart from one another in each row (e.g., may be arranged along the first direction D1). The data line DL and the power voltage line PL may extend in the first direction D1 and may be spaced apart from each other in each column (e.g., may be arranged along the second direction D2).

The pixel circuit PC of the pixel PX may include first, second, third, fourth, fifth, sixth, and seventh transistors T1, T2, T3, T4, T5, T6, and T7 and the capacitor Cst. The first, second, third, fourth, fifth, sixth, and seventh transistors T1, T2, T3, T4, T5, T6, and T7 may include thin-film transistors.

The first transistor T1 is connected to the power voltage line PL via the fifth transistor T5 and is electrically connected to the organic light-emitting diode OLED via the sixth transistor T6. The first transistor T1 that functions as a driving transistor receives the data signal DATA according to a switching operation of the second transistor T2 and supplies the driving current Ioled to the organic light-emitting diode OLED in accordance with the data signal DATA.

The second transistor T2 is connected to the first scan line SL1 and the data line DL, and is turned on according to the first scan signal GW received through the first scan line SL1 and performs a switching operation of transmitting the data signal DATA transmitted to the data line DL to a node N when the second transistor T2 is turned on.

The third transistor T3 is connected to the organic light-emitting diode OLED via the sixth transistor T6. The third transistor T3 is turned on according to the first scan signal GW received through the first scan line SL1 and diode-connect the first transistor T1 when the third transistor T3 is turned on.

The fourth transistor T4 is turned on according to the second signal GI received through the second scan line SL2 and initializes a gate voltage of the first transistor T1 by transmitting the initialization voltage VINT from the initialization voltage line VIL to a gate electrode of the first transistor T1 when the fourth transistor T4 is turned on.

The fifth transistor T5 and the sixth transistor T6 are concurrently (e.g., simultaneously) turned on according to the emission control signal EM received through the emission control line EL and form a current path through which the driving current Ioled may flow from the power voltage line PL to the organic light-emitting diode OLED when the fifth transistor T5 and the sixth transistor T6 are turned on.

The seventh transistor T7 is turned on according to the third scan signal GB received through the third scan line SL3 and initialize the organic light-emitting diode OLED by transmitting the initialization voltage VINT from the initialization voltage line VIL to the organic light-emitting diode OLED when the seventh transistor T7 is turned on. The seventh transistor T7 may be omitted.

In FIG. 4B, the fourth transistor T4 (e.g., a gate electrode thereof) is connected to the second scan line SL2, and the seventh transistor T7 (e.g., a gate electrode thereof) is connected to the third scan line SL3 that is a separate scan line. In another embodiment, the seventh transistor T7 (e.g., the gate electrode thereof) may be connected to the second scan line SL2 along with the fourth transistor T4 (e.g., the gate electrode thereof).

The capacitor Cst may be connected to the gate electrode of the first transistor T1 and the power voltage line PL, and may store and maintain a voltage corresponding to a difference between voltages at the two ends, thereby maintaining a voltage applied to the gate electrode of the first transistor T1.

The organic light-emitting diode OLED may include a pixel electrode and a counter electrode, and the counter electrode may receive the second power voltage ELVSS. The organic light-emitting diode OLED receives the driving current Ioled from the first transistor T1 and emits light in accordance with the driving current Ioled to display an image.

Figure 5:
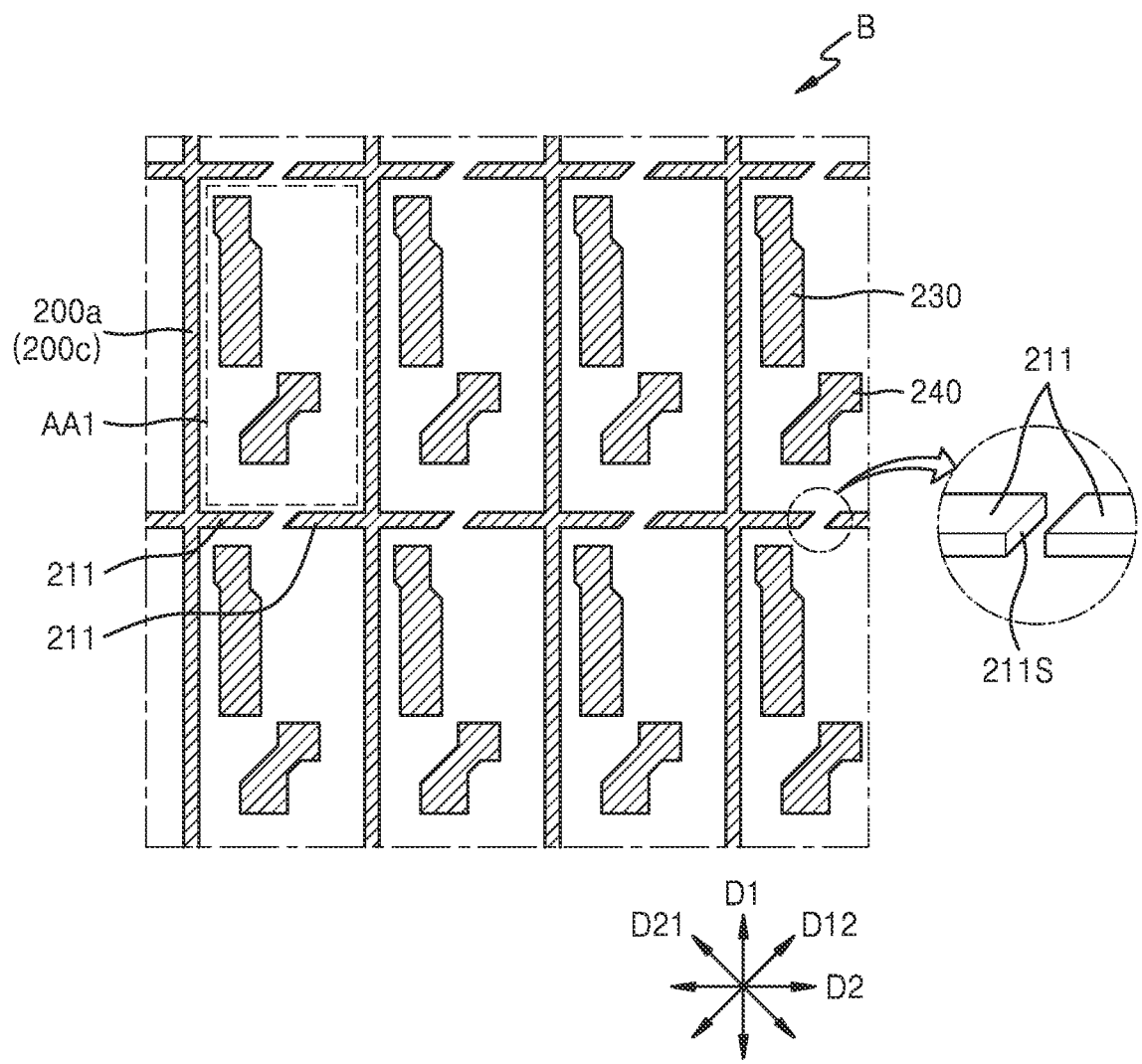
FIGS. 5, 6, 7, and 8 are plan views illustrating a first wiring and a fourth wiring according to an embodiment.
Figure 6:
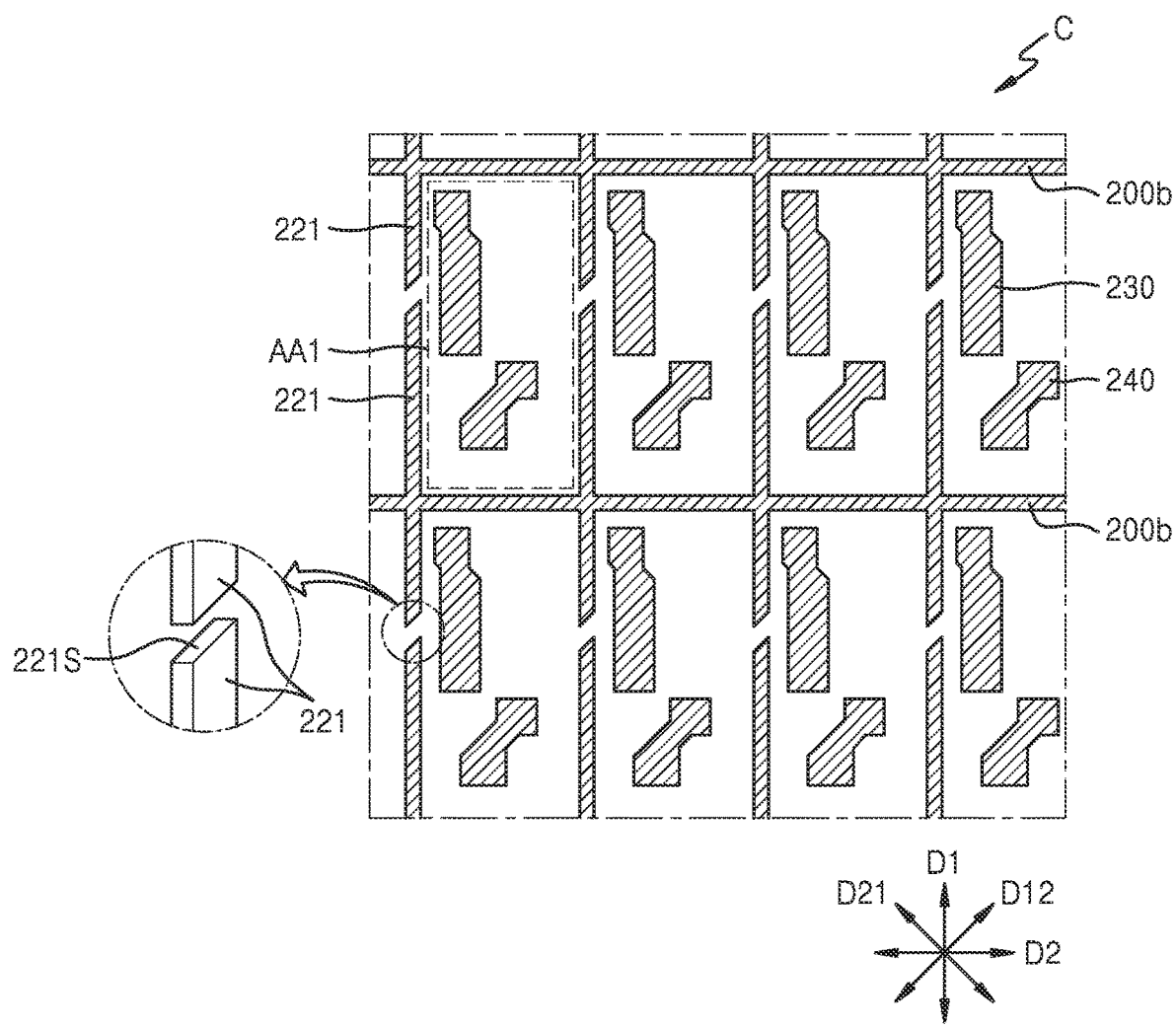
Figure 7:
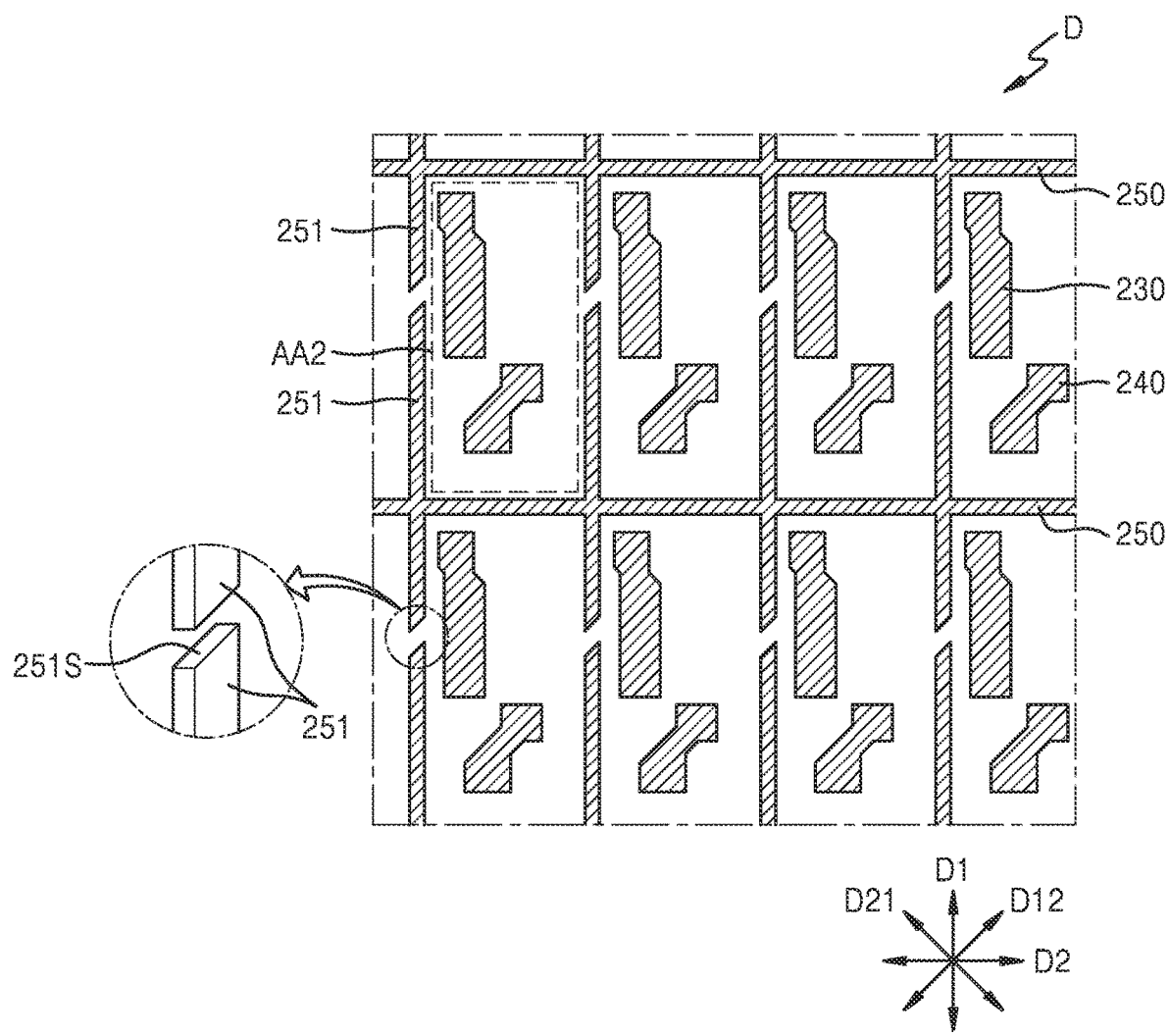
Figure 8:
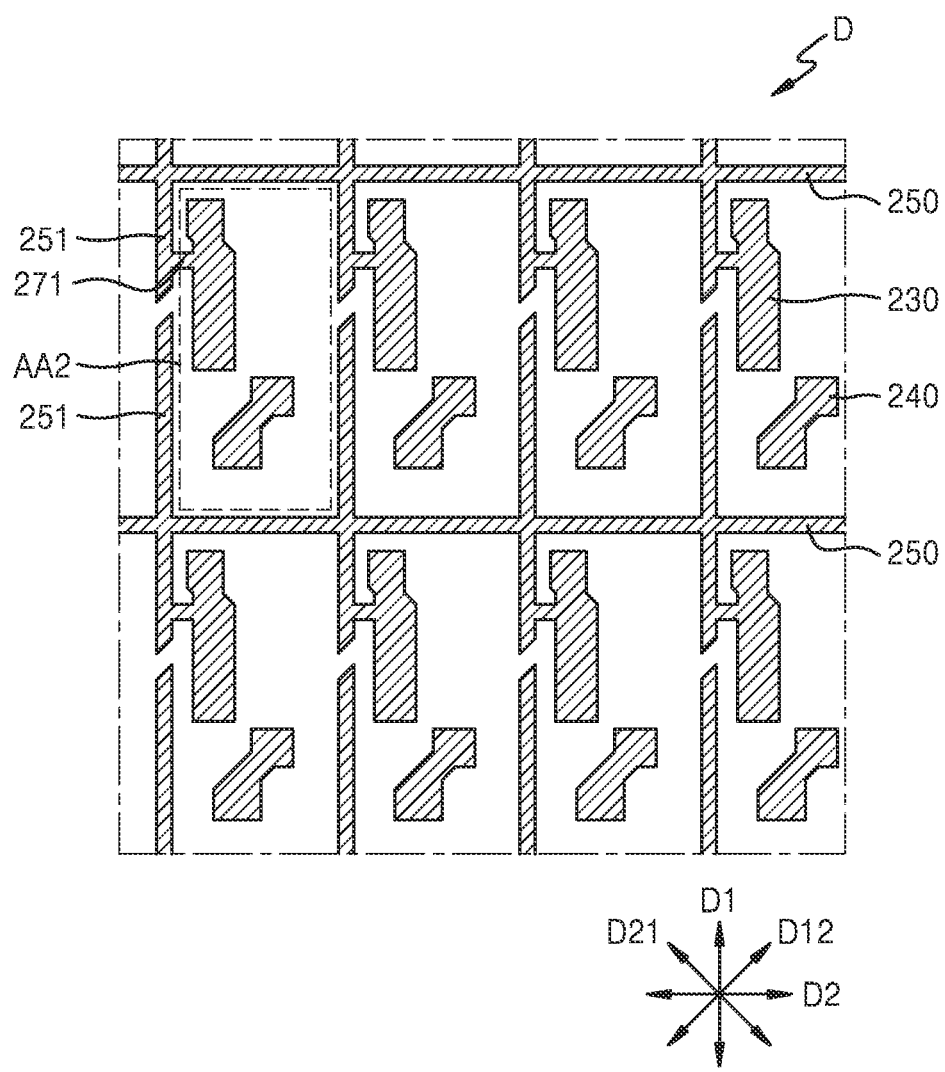

FIGS. 5, 6, 7, and 8 are plan views illustrating a first wiring and a fourth wiring according to an embodiment. FIG. 5 is a partial enlarged plan view illustrating a region B of FIG. 1, FIG. 6 is a partial enlarged plan view illustrating a region C of FIG. 1, and FIGS. 7 and 8 are partial enlarged plan views illustrating a region D of FIG. 1.

Although the first wirings 200 arranged on the right of the virtual central line CL are illustrated in FIGS. 5 and 6, the same description may apply to the first wirings 200 arranged on the left of the virtual central line CL.

Referring to FIG. 5, in the first sub-area SS1 and the third sub-area SS3, the first portion 200a and the third portion 200c of the first wiring 200 may extend in the first direction D1, and the first portion 200a and the third portion 200c may include first branches 211 protruding in the second direction D2. The first branches 211 of the first portion 200a will be described exemplarily, and the same description may apply to the first branches 211 of the third portion 200c.

The first branches 211 of the first portion 200a may symmetrically protrude from the first portion 200a about the first portion 200a of the first wiring 200. That is, the first branches 211 may protrude along the second direction D2 in both directions (e.g., toward both left and right directions along the second direction D2, as shown in FIG. 5) from the first portion 200a of the first wiring 200 extending in the first direction D1. Also, one pair of first branches 211 protruding toward each other from two adjacent first portions 200a from among the first portions 200a that are arranged parallel to one another in the first sub-area SS1 may be located on the same line (e.g., extending in a same line, parallel to the second direction D2). In order to prevent a short circuit between the first wirings 200, end portions of pairs of the first branches 211 extending toward each other from two adjacent first portions 200a may be spaced apart from each other to form a gap (e.g., there is a gap between the end portions of the pairs of branches extending toward each other in a same line from adjacent wirings). The end portions of the first branches 211 facing each other may have an oblique shape inclined in a diagonal direction D12 between the first direction D1 and the second direction D2 in a plan view. A direction in which the end portions of the first branches 211 are inclined may be inclined by an angle (e.g., a predetermined angle) from an extension direction of the first portion 200a. For example, the end portions of the first branches 211 may have an oblique shape inclined by about 45° from the first direction D1. End surfaces 211S of the first branches 211 facing each other on the same line (e.g., of the first branches 211 extending in the same line) may be alternately located. Positions of gaps between pairs of the first branches 211 in the first direction D1 may be substantially the same, and gaps between pairs of the first branches 211 in the second direction D2 may be located at intervals (e.g., predetermined intervals such as at one column interval).

Referring to FIG. 6, in the second sub-area SS2, the second portion 200b of the first wiring 200 may extend in the second direction D2 and may include second branches 221 protruding in the first direction D1. The second branches 221 may protrude from the second portion 200b about the second portion 200b of the first wiring 200. That is, the second branches 221 may protrude along the first direction D1 in both directions (e.g., in the up and down directions along first direction D1, as shown in FIG. 6) from the second portion 200b of the first wiring 200 extending in the second direction D2. Also, one pair of second branches 221 protruding toward each other from two adjacent second portions 200b in the second sub-area SS2 may be located on the same line (e.g., extending parallel to the first direction D1). In order to prevent or substantially prevent a short circuit between the first wirings 200, end portions of pairs of the second branches 221 extending toward each other from two adjacent second portions 200b may be spaced apart from each other to form a gap (e.g., there is a gap between the end portions of the pairs of branches extending toward each other along a same line from adjacent wirings). The end portions of the second branches 221 facing each other may have an oblique shape inclined in the diagonal direction D12 between the first direction D1 and the second direction D2 in a plan view. A direction in which the end portions of the second branches 221 are inclined may be inclined by an angle (e.g., a predetermined angle) from an extension direction of the second portion 200b. For example, the end portions of the second branches 221 may have an oblique shape inclined by about 45° from the second direction D2. End surfaces 221S of the second branches 221 facing each other on the same line may be alternately located. Positions of gaps between pairs of the second branches 221 in the second direction D2 may be substantially the same, and gaps between pairs of the second branches 221 in the first direction D1 may be located at intervals (e.g., predetermined intervals such as at one row interval).

Referring to FIG. 7, in the second area S2, a fourth wiring 250 may be located at the same layer as the first wiring 200. The fourth wiring 250 may include the same material as that of the first wiring 200. The fourth wiring 250 may be spaced apart from the first wirings 200 and may be electrically separated from the first wirings 200. The fourth wiring 250 may extend in the second direction D2 and may include third branches 251 protruding in the first direction D1. The third branches 251 may protrude from the fourth wiring 250 about the fourth wiring 250. That is, the third branches 251 may protrude in the first direction D1 in both directions (e.g., in the up and down directions along the first direction D1, as shown in FIG. 7) from the fourth wiring 250 extending in the second direction D2. Also, one pair of third branches 251 protruding toward each other from two adjacent fourth wirings 250 in the second area S2 may be located on the same line (e.g., extending parallel to the first direction D1). In order to prevent a short circuit between the fourth wirings 250, end portions of pairs of the third branches 251 extending toward each other from two adjacent fourth wirings 250 may be spaced apart from each other to form a gap (e.g., there is a gap between the end portions of the pairs of branches extending toward each other along a same line from adjacent wirings). The end portions of the third branches 251 facing each other may have an oblique shape inclined in the diagonal direction D12 between the first direction D1 and the second direction D2 in a plan view. A direction in which the end portions of the third branches 251 are inclined may be inclined by an angle (e.g., a predetermined angle) from an extension direction of the fourth wiring 250. For example, the end portions of the third branches 251 may have an oblique shape inclined by about 45° from the second direction D2. End surfaces 251s of the third branches 251 facing each other on the same line may be alternately located. Positions of gaps between the third branches 251 in the second direction D2 may be substantially the same, and gaps between the third branches 251 in the first direction D1 may be located at intervals (e.g., predetermined intervals). The fourth wirings 250 may be connected to one another in the peripheral area PA. That is, the fourth wirings 250 may be integrally formed.

As shown in FIGS. 5, 6, and 7, a plurality of conductive patterns may be further located at the same layer (e.g., part of the same layer) as the first wirings 200 and the fourth wirings 250. The conductive patterns may include the first patterns 230. Each of the first patterns 230 may function as a shield electrode for blocking or preventing signal interference between a circuit device located below (e.g., on a lower surface of) the first pattern 230 and a circuit device located above (e.g., on an upper surface of) the first pattern 230 in each pixel PX. The first pattern 230 may be electrically connected to the power voltage line PL connected to the pixel PX and may receive the first power voltage ELVDD. The conductive patterns may further include second patterns 240. Each of the second patterns 240 may function as a bridge electrode for connecting a circuit device located below (e.g., on a lower surface of) the second pattern 240 and a circuit device located above (e.g., on an upper surface of) the second pattern 240 in each pixel PX.

Referring to FIGS. 5 and 6, the first pattern 230 and the second pattern 240 of the first area S1 may be located in a first pattern area AA1 defined by (e.g., enclosed by or surrounded by) the first wiring 200 and the first branch 211 as shown in FIG. 5, and defined by (e.g., enclosed by or surrounded by) the first wiring 200 and the second branch 221 as shown in FIG. 6. Referring to FIG. 7, the first pattern 230 and the second pattern 240 of the second area S2 may be located in a second pattern area AA2 defined by (e.g., enclosed by or surrounded by) the fourth wiring 250 and the third branch 251.

As shown in FIGS. 5, 6, and 7, the first patterns 230 may be physically and electrically separated from the first wirings 200 and the fourth wirings 250. In contrast, as shown in FIG. 8, in some embodiments, each of the first patterns 230 of the second area S2 may be connected to the third branch 251 of the fourth wiring 250 by a bridge 271. In an embodiment, the fourth wirings 250, the first patterns 230, and the bridges 271 located in the second area S2 may be integrally formed. The fourth wirings 250 located in the second area S2 may receive the first power voltage ELVDD through the first pattern 230 electrically connected to the power voltage line PL.

In FIGS. 7 and 8, the fourth wirings 250 located in the second area S2 extend in the second direction D2 to be spaced apart from each other and include the third branches 251 protruding from the fourth wirings 250 in the first direction D1. However, in another embodiment, the fourth wirings 250 may have a grid structure in which the fourth wirings 250 are connected to one another (e.g., without gaps between third branches 251, where the third branches 251 connect to one another).

In FIGS. 5, 6, 7, and 8, end portions of the first branches 211, the second branches 221, and the third branches 251 have an oblique shape inclined in the diagonal direction D12 between the first direction D1 and the second direction D2 in a plan view. In another embodiment, end portions of the first branches 211, the second branches 221, and the third branches 251 may have an oblique shape inclined in an anti-diagonal direction D21 between the first direction D1 and the second direction D2.

Figure 9A:
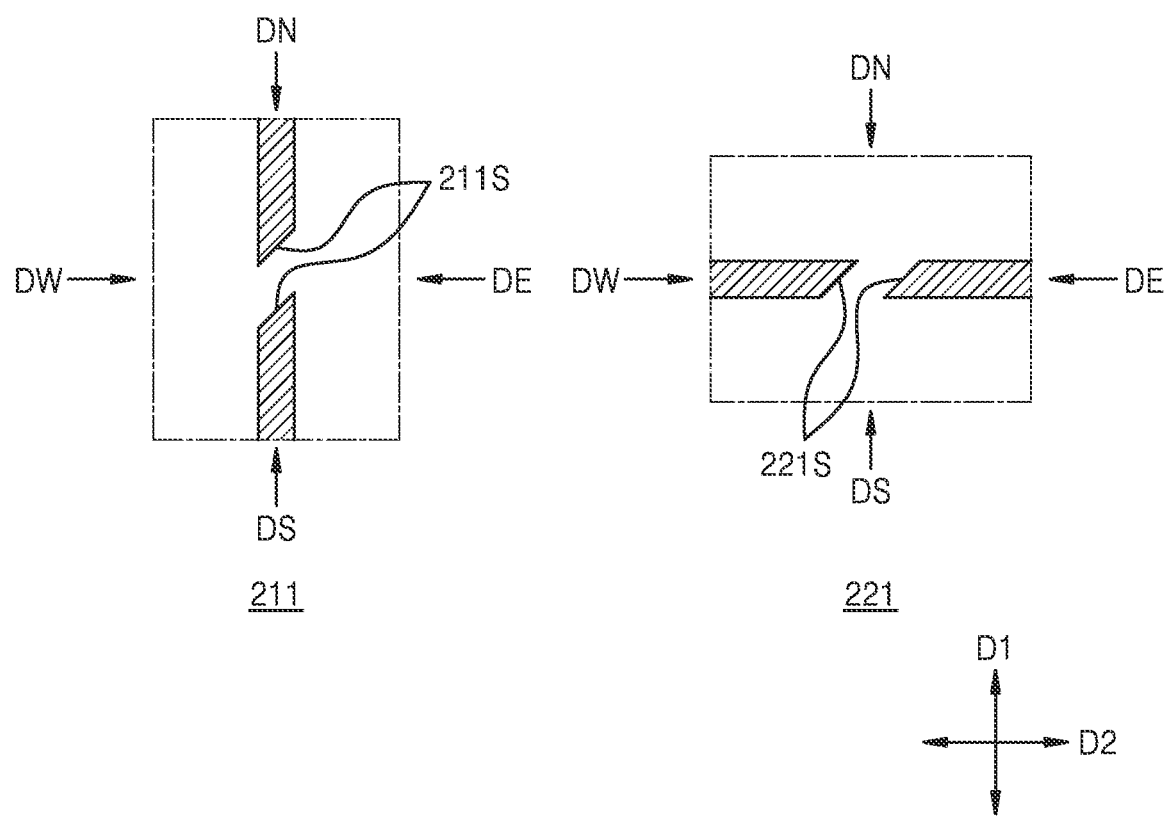
FIG. 9A is a plan view illustrating a branch including an end portion having an oblique shape according to an embodiment.
Figure 9B:
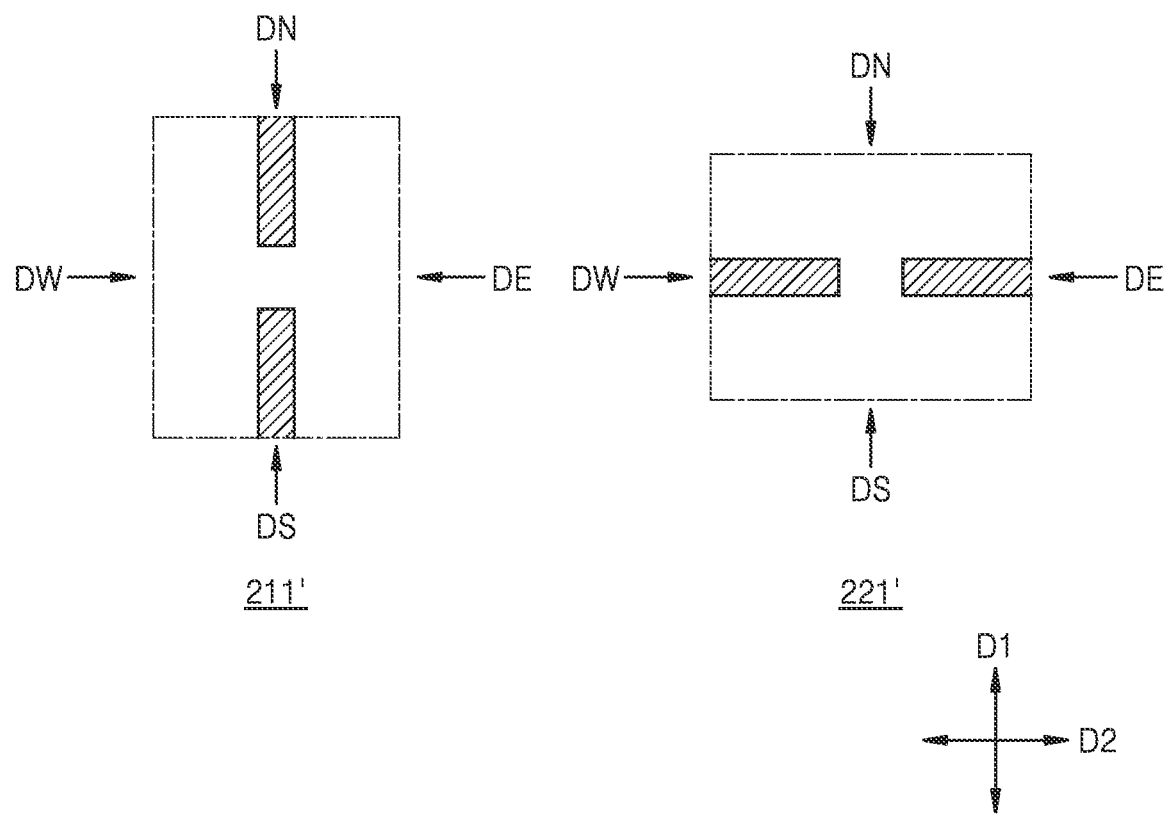
FIG. 9B is a plan view illustrating a branch including a vertical or horizontal end portion according to a comparative example.

FIG. 9A is a plan view illustrating a branch including an end portion having an oblique shape according to an embodiment. FIG. 9B is a plan view illustrating a branch including a vertical or horizontal end portion according to a comparative example.

In FIG. 9B, a first branch 211' and a second branch 221' include horizontal or vertical end surfaces in the first direction D1 and the second direction D2. When a user looks at the first branch 211' and the second branch 221' obliquely (e.g., at an angle of about 45° with respect to a main surface or plane of a substrate) in four directions (e.g., an east direction DE, a west direction DW, a south direction DS, and a north direction DN), the user may see light reflected (or scattered) by an end surface of the first branch 211' only when the user sees the first branch 211' in the south direction DS and the north direction DN and may see light reflected (scattered) by an end surface of the second branch 221' only when the user sees the second branch 221' in the east direction DE and the west direction DW. That is, in the comparative example, because densities of an end surface seen in directions are different, the first area S1 and the second area S2 may be distinguishably seen (e.g., may appear different to the user), and/or the first sub-area SS1, the second sub-area SS2, and the third sub-area SS3 may be distinguishably seen (e.g., may appear different to the user), thereby resulting in a visual artifact.

However, as shown in FIG. 9A, when end portions of the first branch 211 and the second branch 221 of the first wiring 200 have an oblique shape and the user looks at the first branch 211 and the second branch 221 obliquely (e.g., at an angle of 45° with respect to the main surface or plane of the substrate) in the four directions (i.e., the east direction DE, the west direction DW, the south direction DS, and the north direction DN), the user may see light reflected (or scattered) by the end surface 211S of the first branch 211 and the end surface 221S of the second branch 221 in each of the four directions (i.e., the east direction DE, the west direction DW, the south direction DS, and the north direction DN). When the user looks at the third branch 251 of the fourth wiring 250 in the four directions (i.e., the east direction DE, the west direction DW, the south direction DS, and the north direction DN), the user may see light reflected (or scattered) by the end surface 251S (see FIG. 7) of the third branch 251 in each of the four directions (i.e., the east direction DE, the west direction DW, the south direction DS, and the north direction DN).

That is, because end portions of the first branch 211 and the second branch 221 of the first wiring 200 and an end portion of the third branch 251 of the fourth wiring 250 are obliquely formed according to an embodiment, densities of an end surface seen in directions are the same and reflection (or scattering) characteristics of light in the first area S1 and the second area S2 are similar to each other (e.g., both reflect light similarly), thereby preventing or minimizing the first area S1 and the second area S2 from being distinguishably seen (or appearing different to the user) and/or the first sub-area SS1, the second sub-area SS2, and the third sub-area SS3 from being distinguishably seen (or appearing different to the user) according to an angle of incidence of light.

Figure 10:
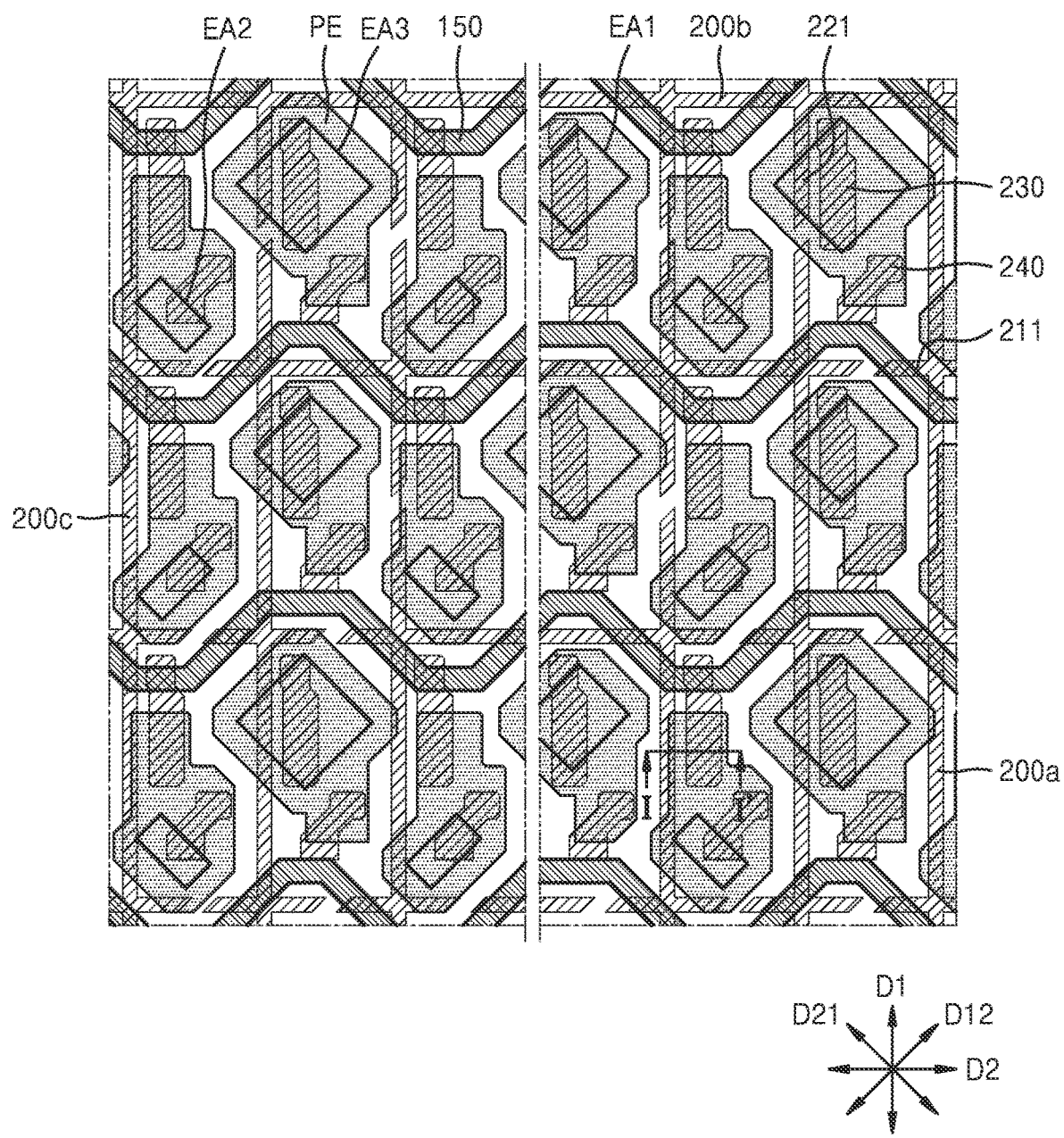
FIGS. 10 and 11 are partial plan views of a display panel according to an embodiment.
Figure 11:
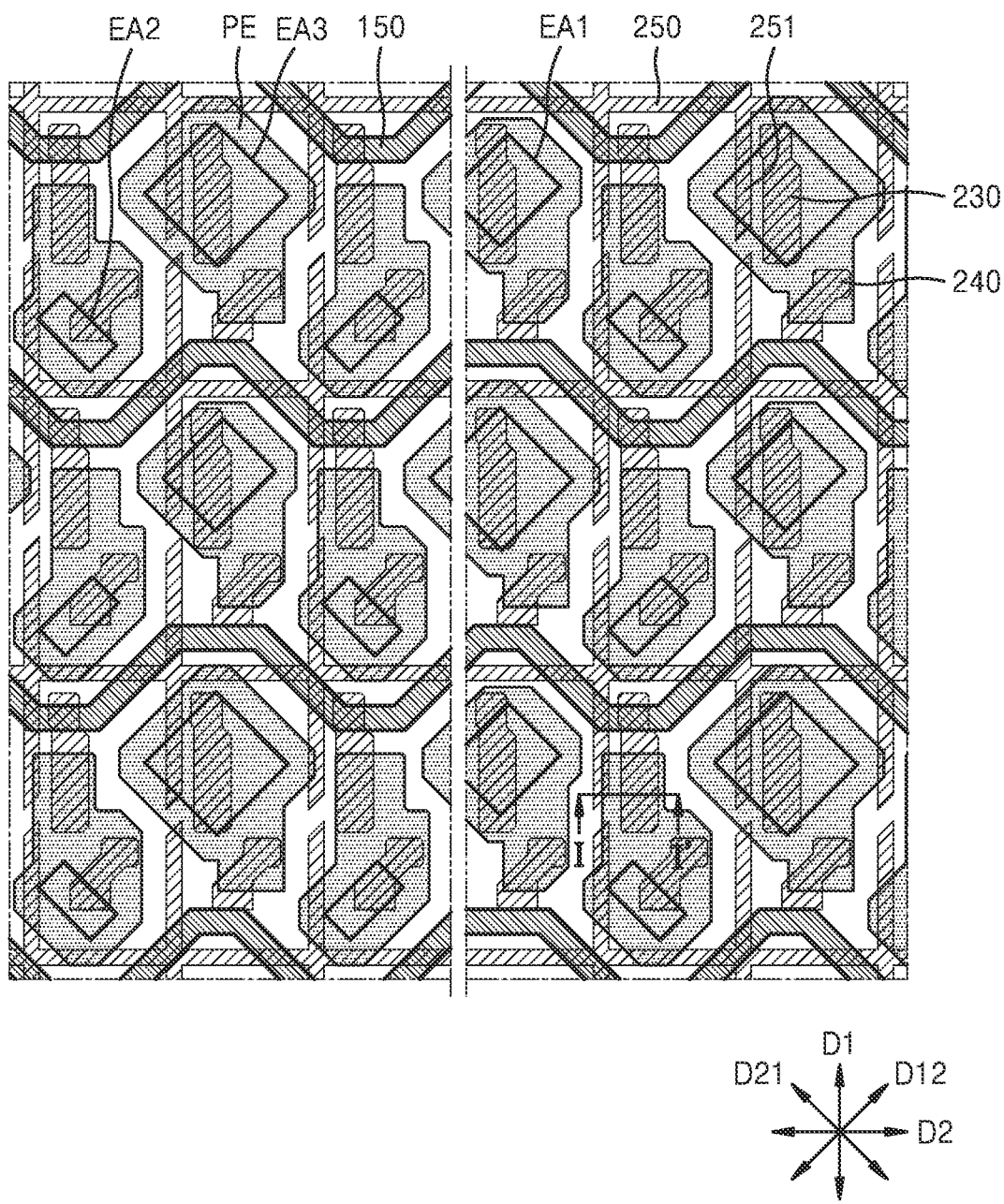
Figure 12:
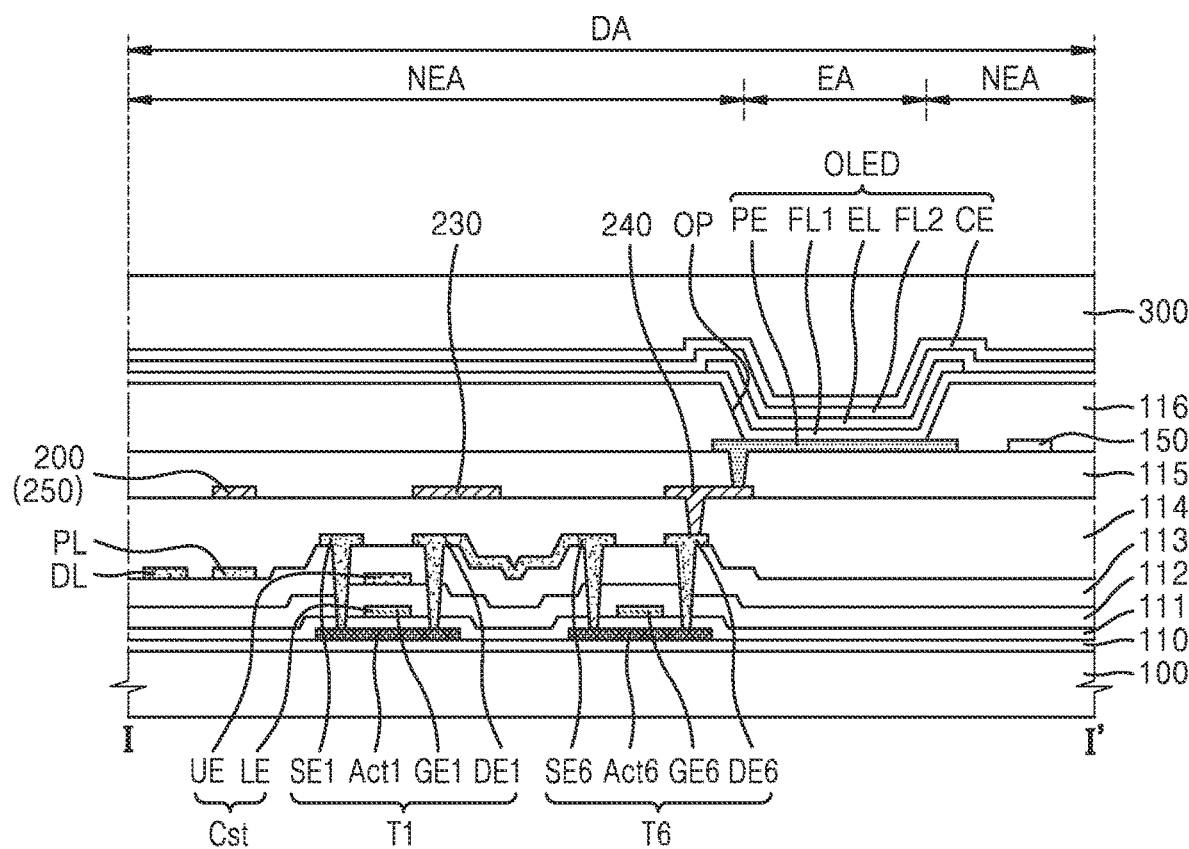
FIG. 12 is a cross-sectional view of the display panel taken along line I-I' of FIG. 10.

FIGS. 10 and 11 are partial plan views of a display panel according to an embodiment. FIG. 12 is a cross-sectional view of the display panel taken along line I-I' of FIG. 10.

FIG. 10 is a plan view illustrating an arrangement of a first wiring and a pixel electrode according to an embodiment. FIG. 11 is a plan view illustrating an arrangement of a fourth wiring and a pixel electrode according to an embodiment. FIG. 12 is a cross-sectional view illustrating a stacked relationship of some elements included in a pixel located in a display area of a substrate and some wirings connected to the pixel. FIG. 12 is a cross-sectional view illustrating the first transistor T1, the sixth transistor T6, the capacitor Cst, and the organic light-emitting diode OLED of FIG. 4B. The following will be described with reference to FIGS. 10, 11, and 12.

The substrate 100 may be formed of any of various materials such as a glass material, a metal material, or a plastic material. According to an embodiment, the substrate 100 may be a flexible substrate and may include a polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The substrate 100 may have a multi-layer structure including a layer including the polymer resin and an inorganic layer. A buffer layer 110 may be located on (e.g., directly on) the substrate 100.

The buffer layer 110 may have a single or multi-layer structure formed of an inorganic insulating material such as silicon oxide, silicon nitride, or silicon oxynitride. A barrier layer for preventing penetration of external air may be further provided between the substrate 100 and the buffer layer 110. The buffer layer 110 may be omitted.

The first transistor T1 and the sixth transistor T6 may be located on (e.g., directly on) the buffer layer 110. The first transistor T1 may include a semiconductor layer Act1, a gate electrode GE1, a source electrode SE1, and a drain electrode DE1. The sixth transistor T6 may include a semiconductor layer Act6, a gate electrode GE6, a source electrode SE6, and a drain electrode DE6.

The semiconductor layer Act1 of the first transistor T1 and the semiconductor layer Act6 of the sixth transistor T6 may include amorphous silicon, polycrystalline silicon, or an organic semiconductor material. Each of the semiconductor layers Act1 and Act6 may include a source region, a drain region, and a channel region between the source region and the drain region. A first insulating layer 111 may be located on (e.g., directly on) the semiconductor layers Act1 and Act6.

Each of the gate electrode GE1 of the first transistor T1 and the gate electrode GE6 of the sixth transistor T6 may have a single or multi-layer structure formed of at least one material from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), considering adhesion to an adjacent layer, a surface flatness of a stacked layer, and processability. A second insulating layer 112 may be located on (e.g., directly on) the gate electrodes GE1 and GE6.

Each of the source electrode SE1 and the drain electrode DE1 of the first transistor T1 and the source electrode SE6 and the drain electrode DE6 of the sixth transistor T6 may have a single or multi-layer structure formed of at least one material from among, for example, Al, Pt, Pd, Ag, Mg, Au, Ni, Nd, Ir, Cr, Li, Ca, Mo, Ti, W, and Cu. The source electrodes SE1 and SE6 and the drain electrodes DE1 and DE6 may be respectively electrically connected to source regions and drain regions of the semiconductor layers Act1 and Act6 through contact holes formed in the first insulating layer 111, the second insulating layer 112, and a third insulating layer 113. The drain electrode DE1 of the first transistor T1 and the source electrode SE6 of the sixth transistor T6 may be connected to each other.

The capacitor Cst includes a lower electrode LE and an upper electrode UE overlapping each other with the second insulating layer 112 therebetween. The capacitor Cst may overlap the first transistor T1. In FIG. 12, the gate electrode GE1 of the first transistor T1 is the lower electrode LE of the capacitor Cst. In another embodiment, the capacitor Cst may not overlap the first transistor T1, and the lower electrode LE of the capacitor Cst may be an element independent of the gate electrode GE1 of the first transistor T1. The upper electrode UE of the capacitor Cst may have a single or multi-layer structure formed of at least one material from among Al, Pt, Pd, Ag, Mg, Au, Ni, Nd, Ir, Cr, Li, Ca, Mo, Ti, W, and Cu. The capacitor Cst may be covered by the third insulating layer 113.

Each of the first insulating layer 111, the second insulating layer 112, and the third insulating layer 113 may be an inorganic insulating layer including an inorganic material such as silicon oxide, silicon nitride, and/or silicon oxynitride.

Various conductive layers may be further located on (e.g., directly on) the third insulating layer 113. For example, the data line DL and the power voltage line PL may be located on (e.g., directly on) the third insulating layer 113, that is, on the same layer as the source electrodes SE1 and SE6 and the drain electrodes DE1 and DE6. Each of the data line DL and the power voltage line PL may include Mo, Al, Cu, or Ti, and may have a single or multi-layer structure. In an embodiment, each of the data line DL and the power voltage line PL may have a multi-layer structure formed of Ti/Al/Ti.

A fourth insulating layer 114 may be located on (e.g., directly on) the data line DL and the power voltage line PL.

The first wiring 200 and the fourth wiring 250 may be located on (e.g., directly on) the fourth insulating layer 114. Each of the first wiring 200 and the fourth wiring 250 may have a single or multi-layer structure including at least one from among Mo, Al, Cu, Ti, and an alloy thereof. In an embodiment, each of the first wiring 200 and the fourth wiring 250 may have a multi-layer structure formed of Ti/Al/Ti. Each of the first wiring 200 and the fourth wiring 250 may at least partially overlap the power voltage line PL. The first pattern 230 and the second pattern 240 may also be located on (e.g., directly on) the fourth insulating layer 114. The first pattern 230 and the second pattern 240 may include the same material as that of the first wiring 200 and the fourth wiring 250. The second pattern 240 may function as a connection member for electrically connecting the sixth transistor T6 to the organic light-emitting diode OLED.

A fifth insulating layer 115 may be located on (e.g., directly on) the first wiring 200, the fourth wiring 250, the first pattern 230, and the second pattern 240.

Each of the fourth insulating layer 114 and the fifth insulating layer 115, which are planarization insulating layers, may be an organic insulating layer. Each of the fourth insulating layer 114 and the fifth insulating layer 115 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. In an embodiment, each of the fourth insulating layer 114 and the fifth insulating layer 115 may include polyimide (PI).

The organic light-emitting diode OLED that is a display element may be located on (e.g., directly on) the fifth insulating layer 115. The organic light-emitting diode OLED may include a pixel electrode PE, an intermediate layer EL, and a counter electrode CE.

The pixel electrode PE may be located on (e.g., directly on) the fifth insulating layer 115, and may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode PE may include a reflective film including Ag, Mg, Al, Pt, Pd, Au, Ni, Nd, Ir, Cr, or a compound thereof. In another embodiment, the pixel electrode PE may further include a film formed of ITO, IZO, ZnO, or $In_2O_3$ over/under the reflective film. The pixel electrode PE may be electrically connected to the source electrode SE or the drain electrode DE of the sixth transistor T6 through the second pattern 240 located on (e.g., directly on) the fourth insulating layer 114.

A shield member 150 may be further located on (e.g., directly on) the fifth insulating layer 115. The shield member 150 may extend in the second direction D2 along (e.g., adjacent or alongside) a part of an edge of the pixel electrode PE so as not to overlap the pixel electrode PE in a plan view (see, e.g., FIGS. 11 and 12), and may be located in each row (e.g., each row may have a corresponding shield member 150). The shield member 150 may extend in a linear or zigzag fashion in the second direction D2 according to an arrangement of the pixel electrodes PE of the same row. The shield member 150 may include a metal that blocks light. For example, the shield member 150 may include Mo, Al, Cu, or Ti and may have a single or multi-layer structure including the above material. In an embodiment, the shield member 150 may have a multi-layer structure formed of Ti/Al/Ti. The shield member 150 may include the same material as that of the pixel electrode PE. The shield members 150 may be spaced apart from one another and may be independently provided for each row. The shield members 150 may be floated (e.g., electrically floating), or may be electrically connected to a constant voltage wiring (e.g., a power voltage line or an initialization voltage line) to receive a constant voltage.

A sixth insulating layer 116 may be located on the fifth insulating layer 115. The sixth insulating layer 116 may function as a pixel-defining film by having an opening OP that corresponds to each pixel and through which a part of the pixel electrode PE is exposed. The sixth insulating layer 116 may include an organic material such as acryl, benzocyclobutene (BCB), PI, or hexamethyldisiloxane (HMDSO). Alternatively, the sixth insulating layer 116 may include the above inorganic material. The opening OP of the sixth insulating layer 116 or a portion of the pixel electrode PE exposed by the opening OP of the sixth insulating layer 116 is defined as an emission area EA. The emission layer EL may be located in the emission area EA. Sizes of an emission area EA1 of a first pixel, an emission area EA2 of a second pixel, and an emission area EA3 of a third pixel may be different from one another. A column in which the first emission area EA1 and the third emission area EA3 are alternately and repeatedly formed in (e.g., along) the first direction D1 and a column in which the second emission area EA2 is repeatedly formed are repeatedly formed in (e.g., along) the second direction D2. That is, the first emission area EA1, the second emission area EA2, the third emission area EA3, and the second emission area EA2 are repeatedly formed in (e.g., along) the second direction D2.

A non-emission area NEA that is located outside the emission area EA of each pixel may surround the emission areas EA of the pixels. That is, the display area DA may include a plurality of emission areas EA and the non-emission area NEA surrounding the emission areas EA, and the peripheral area PA may include a non-emission area.

The emission layer EL may be located on the pixel electrode PE exposed through the opening OP of the sixth insulating layer 116. The emission layer EL may include a high molecular weight organic material or a low molecular weight organic material that emits light of a color (e.g., a predetermined color). The emission layer EL may be a red emission layer, a green emission layer, or a blue emission layer. Alternatively, the emission layer EL may have a multi-layer structure in which a red emission layer, a green emission layer, and a blue emission layer are stacked to emit white light, or a single-layer structure including a red emission material, a green emission material, and a blue emission material. In an embodiment, a first functional layer FL1 may be further located under the emission layer EL and/or a second functional layer FL2 may be further located over the emission layer EL. The first functional layer FL1 and/or the second functional layer FL2 may include a layer that is integrally formed over the plurality of pixel electrodes PE, or may include layers patterned to respectively correspond to the plurality of pixel electrodes PE.

The first functional layer FL1 may have a single or multi-layer structure. For example, when the first functional layer FL1 is formed of a high molecular weight material, the first functional layer FL1 that is a hole transport layer (HTL) having a single-layer structure may be formed of poly-(3, 4)-ethylene-dihydroxy thiophene (poly(3,4-ethylenedioxythiophene) (PEDOT) or polyaniline (PANI). When the first functional layer FL1 is formed of a low molecular weight material, the first functional layer FL1 may include a hole injection layer (HIL) and an HTL.

The second functional layer FL2 may be omitted. For example, when each of the first functional layer FL1 and the emission layer EL is formed of a high molecular weight material, it is preferable that the second functional layer FL2 is formed to improve the characteristics of the organic light-emitting diode OLED. The second functional layer FL2 may have a single or multi-layer structure. The second functional layer FL2 may include an electron transport layer (ETL) and/or an electron injection layer (EIL).

The counter electrode CE faces the pixel electrode PE with the emission layer EL therebetween. In other words, the counter electrode CE and the pixel electrode PE are located on opposite sides of the emission layer EL. The counter electrode CE may be formed of a conductive material having a low work function. For example, the counter electrode CE may include a transparent layer or a semi-transparent layer including Ag, Mg, Al, Pt, Pd, Au, Ni, Nd, Ir, Cr, Li, Ca, or an alloy thereof. Alternatively, the counter electrode CE may further include a layer formed of ITO, IZO, ZnO, or $In_2O_3$ provided on the transparent or semi-transparent layer including the above material. The counter electrode CE may be located on the emission layer EL and the sixth insulating layer 116. The counter electrode CE may be a common electrode integrally formed with the plurality of organic light-emitting diode OLEDs in the display area DA and facing the plurality of pixel electrodes PE.

An encapsulation layer 300 may be located on the organic light-emitting diode OLED. The encapsulation layer 300 may include at least one inorganic encapsulation layer including an inorganic material and at least one organic encapsulation layer including an organic material. In some embodiments, the encapsulation layer may include a stack of one or more organic layers and one or more inorganic layers. The organic encapsulation layer may have a thickness greater than that of the inorganic encapsulation layer. In some embodiments, the encapsulation layer 300 may have a structure in which a first inorganic encapsulation layer, an organic encapsulation layer, and a second inorganic encapsulation layer are stacked. An inorganic material of the first inorganic encapsulation layer and an inorganic material of the second inorganic encapsulation layer may be the same or different from each other. The first inorganic encapsulation layer may have a two-layer structure including different inorganic materials. A capping layer covering the counter electrode CE may be further located between the counter electrode CE of the organic light-emitting diode OLED and the encapsulation layer 300. In another embodiment, an encapsulation substrate may be located on the organic light-emitting diode OLED to face the substrate 100 and may be adhered by using a sealing member such as a sealant or frit to the substrate 100 outside the display area DA.

Figure 13:
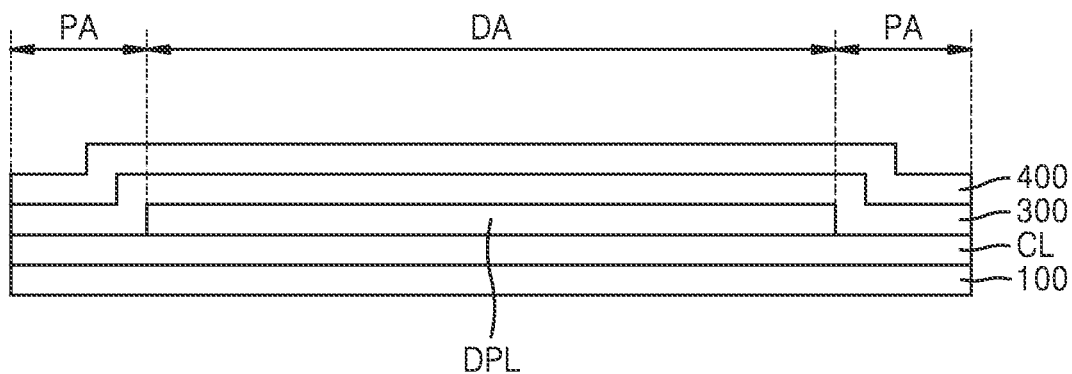
FIG. 13 is a cross-sectional view of a display apparatus according to an embodiment.
Figure 14:
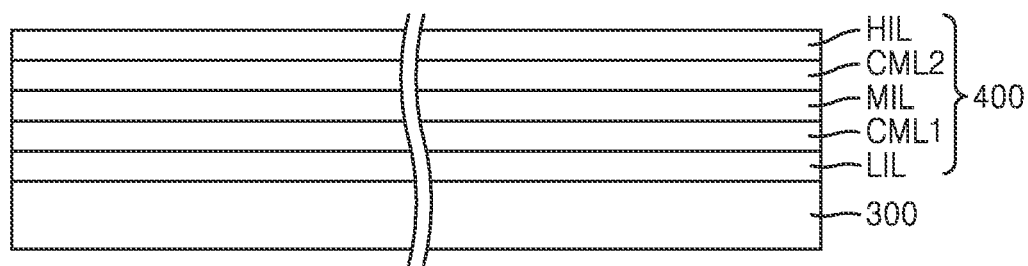
FIGS. 14 and 15 are respectively a cross-sectional view and a plan view illustrating an input sensing layer on a display panel according to an embodiment.
Figure 15:
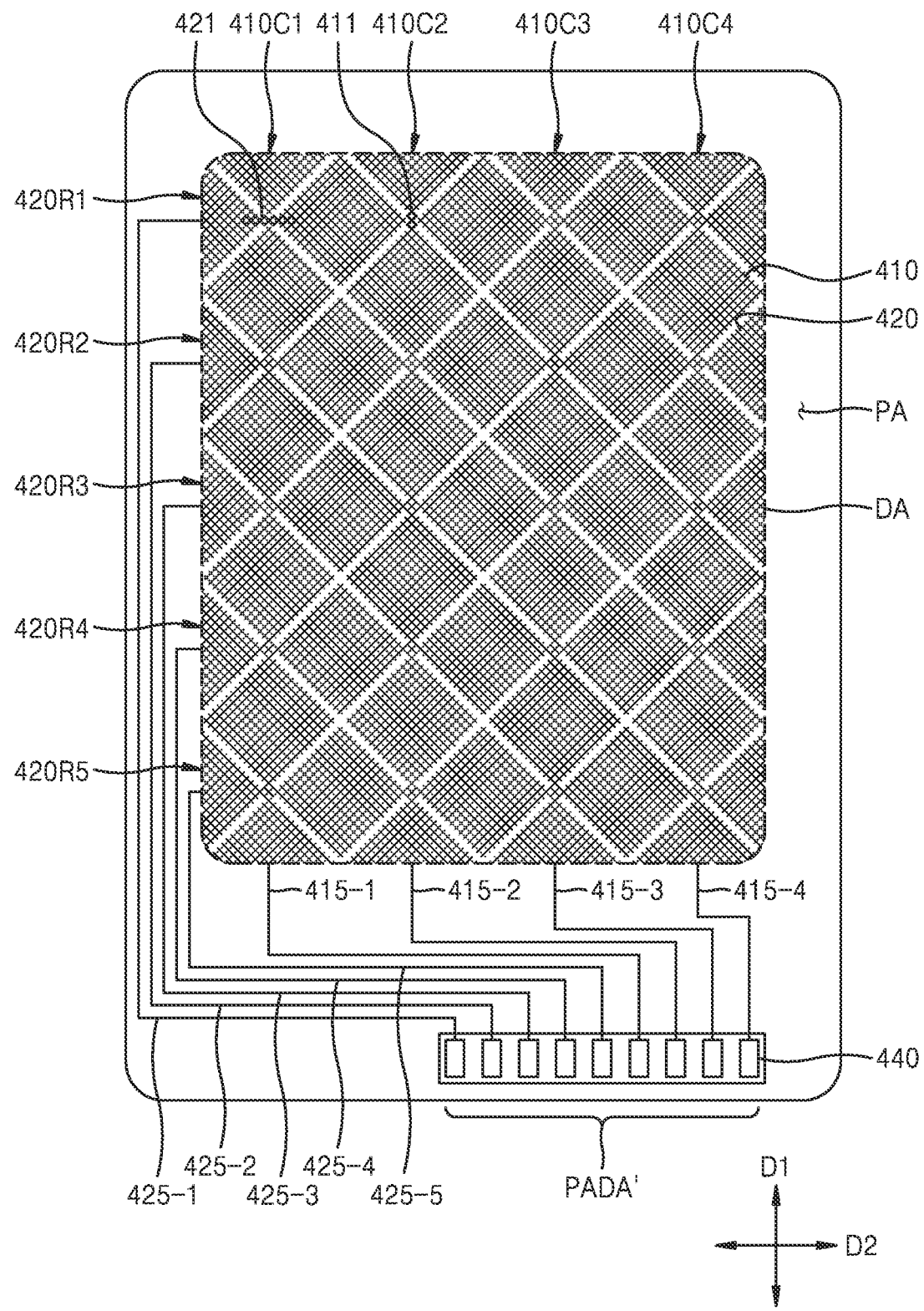

FIG. 13 is a cross-sectional view of a display apparatus according to an embodiment. FIGS. 14 and 15 are respectively a cross-sectional view and a plan view illustrating an input sensing layer on a display panel according to an embodiment. FIGS. 16A, 16B, 16C, and 16D are plan views illustrating an input sensing layer according to layers.

Referring to FIG. 13, a display apparatus according to an embodiment may include the substrate 100, a circuit layer CIL located on the substrate 100, a display layer DPL, the encapsulation layer 300, and an input sensing layer 400.

The circuit layer CIL may include a plurality of insulating layers, a plurality of conductive layers, and a semiconductor layer. The plurality of conductive layers may constitute the pixel circuit PC of the pixel PX and/or signal lines. The display layer DPL may include the plurality of OLEDs. The encapsulation layer 300 may cover the display area DA and may extend to the outside of the display area DA.

The input sensing layer 400 may be located on the encapsulation layer 300. As shown in FIG. 14, the input sensing layer 400 may include a first conductive layer CML1 and a second conductive layer CML2 located above the encapsulation layer 300. A lower insulating layer LIL may be located between the first conductive layer CML1 and the encapsulation layer 300, an intermediate insulating layer MIL may be located between the first conductive layer CML1 and the second conductive layer CML2, and an upper insulating layer HIL may be located on the second conductive layer CML2.

Each of the first and second conductive layers CML1 and CML2 includes a metal. For example, each of the first and second conductive layers CML1 and CML2 may include Mo, Al, Cu, or Ti, and may have a single or multi-layer structure including the above material. In an embodiment, each of the first and second conductive layers CML1 and CML2 may have a multi-layer structure formed of Ti/Al/Ti.

In an embodiment, each of the lower insulating layer LIL and the intermediate insulating layer MIL may be an inorganic insulating layer formed of silicon nitride, and the upper insulating layer HIL may include an organic insulating layer. Although the lower insulating layer LIL is located between the encapsulation layer 300 and the first conductive layer CML1 in FIG. 14, in another embodiment, the lower insulating layer LIL may be omitted and the first conductive layer CML1 may be directly located on the encapsulation layer 300 of the display panel 10. In another embodiment, each of the lower insulating layer LIL and the intermediate insulating layer MIL may include an organic insulating layer.

Referring to FIG. 15, the input sensing layer 400 may have a shape corresponding to the display panel 10. The input sensing layer 400 may include the display area DA and the peripheral area PA corresponding to the display area DA and the peripheral area PA of the display panel 10. The input sensing layer 400 may include first sensing electrodes 410, first signal lines 415-1, 415-2, 415-3, and 415-4 connected to the first sensing electrodes 410, second sensing electrodes 420, and second signal lines 425-1, 425-2, 425-3, 425-4, and 425-5 connected to the second sensing electrodes 420. The input sensing layer 400 may sense an external input by using a mutual cap method and/or a self-cap method.

The first sensing electrodes 410 may be arranged in (or extend in) the first direction D1 and spaced apart from each other along the second direction D2, and the second sensing electrodes 420 may be arranged in (or extend in) the second direction D2 and spaced apart from each other along the first direction D1. The first sensing electrodes 410 arranged in the first direction D1 may be connected to one another by first connection electrodes 411 between neighboring first sensing electrodes 410, and may form first sensing lines 410C1, 410C2, 410C3, and 410C4. The second sensing electrodes 420 arranged in the second direction D2 may be connected to one another by second connection electrodes 421 between neighboring second sensing electrodes 420 and may form second sensing lines 420R1, 420R2, 420R3, 420R4, and 420R5.

The first sensing lines 410C1, 410C2, 410C3, and 410C4 and the second sensing lines 420R1, 420R2, 420R3, 420R4, and 420R5 may cross each other. For example, the first sensing lines 410C1, 410C2, 410C3, and 410C4 and the second sensing lines 420R1, 420R2, 420R3, 420R4, and 420R5 may be perpendicular to each other.

The first sensing lines 410C1, 410C2, 410C3, and 410C4 and the second sensing lines 420R1, 420R2, 420R3, 420R4, and 420R5 may be located in the display area DA and may be connected to a sensing signal pad 440 through the first and second signal lines 415-1, 415-2, 415-3, and 415-4 and 425-1, 425-2, 425-3, 425-4, and 425-5 formed in the peripheral area PA. The first sensing lines 410C1, 410C2, 410C3, and 410C4 may be respectively connected to the first signal lines 415-1, 415-2, 415-3, and 415-4, and the second sensing lines 420R1, 420R2, 420R3, 420R4, and 420R5 may be respectively connected to the second signal lines 425-1, 425-2, 425-3, 425-4, and 425-5. In FIG. 15, four first sensing lines 410C1, 410C2, 410C3, and 410C4 and five second sensing lines 420R1, 420R2, 420R3, 420R4, and 420R5 are exemplarily illustrated.

Figure 16A:
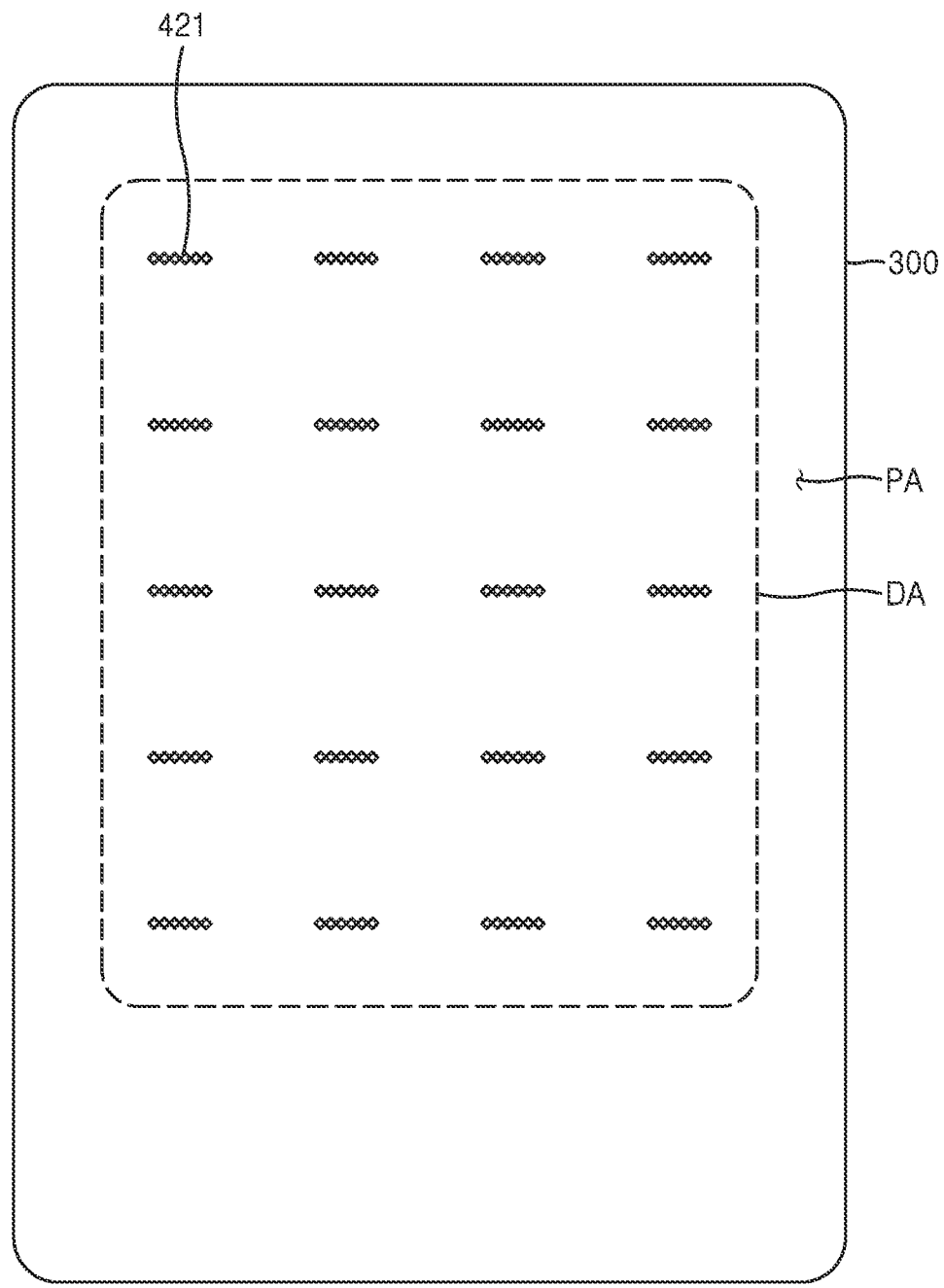
FIGS. 16A, 16B, 16C, and 16D are plan views illustrating the input sensing layer according to layers.
Figure 16B:
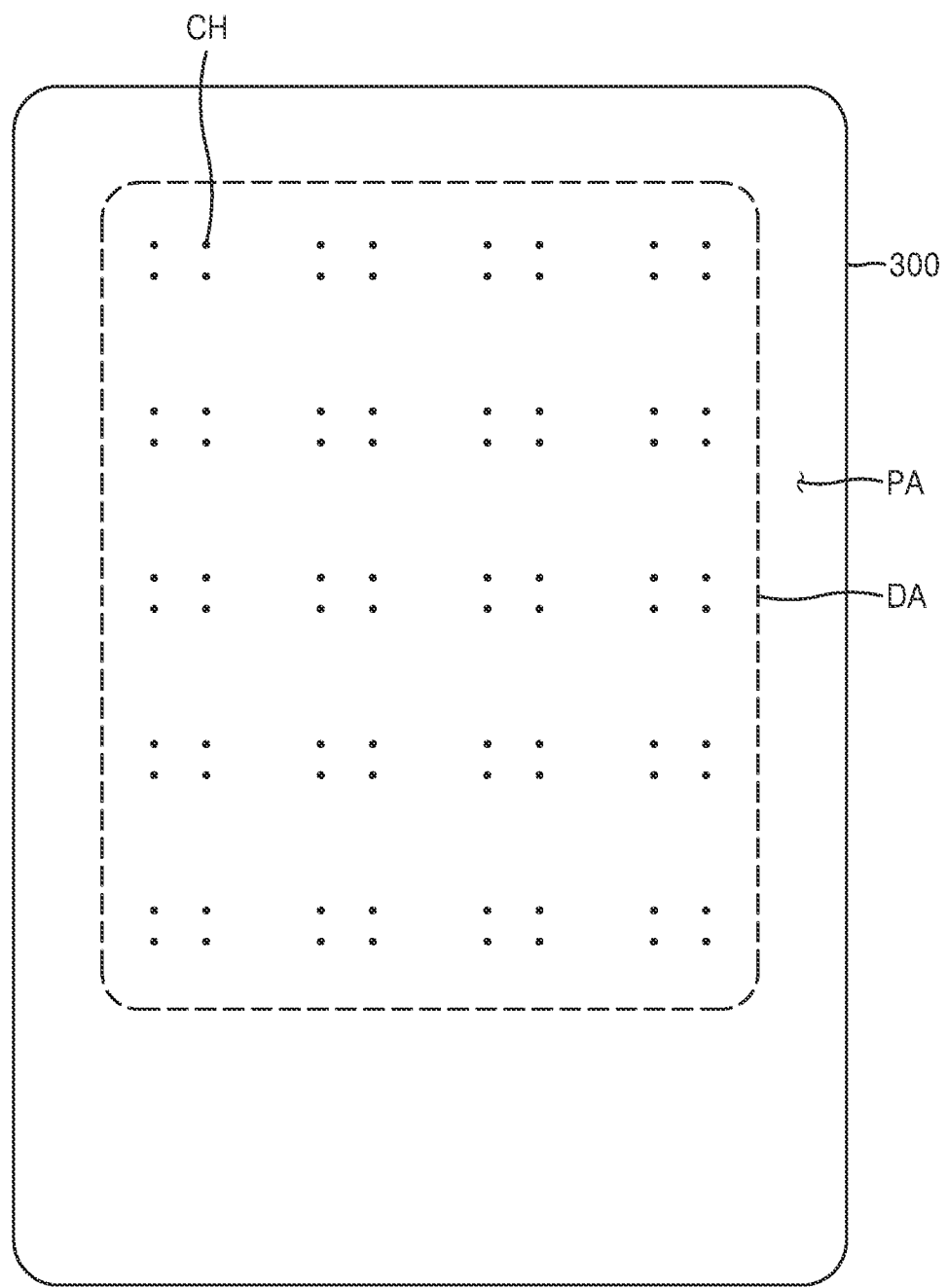
Figure 16C:
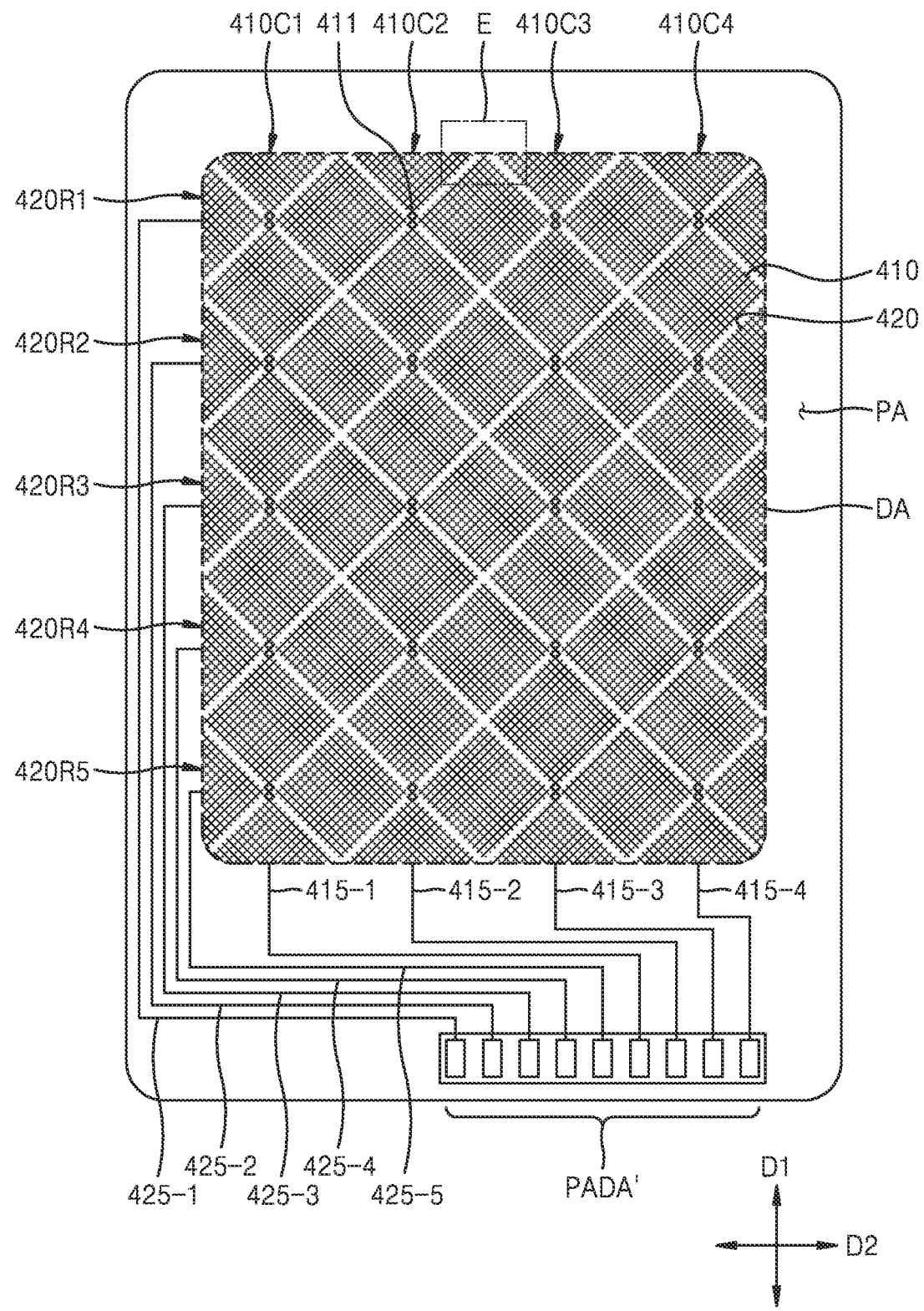

As shown in FIG. 16A, the first conductive layer CML1 may include the second connection electrodes 421. The second conductive layer CML2 may include the first sensing electrodes 410, the first connection electrodes 411, and the second sensing electrodes 420 as shown in FIG. 16C. The first sensing electrodes 410 may be connected to one another by the first connection electrodes 411 formed on the same layer as the first sensing electrodes 410. The second sensing electrodes 420 may be connected to one another by the second connection electrodes 421 formed on layers different from the second sensing electrodes 420. The second connection electrode 421 that electrically connects neighboring second sensing electrodes 420 may be connected to the neighboring second sensing electrodes 420 through a contact hole CH formed in the intermediate insulating layer MIL as shown in FIGS. 14 and 16B.

Figure 16D:
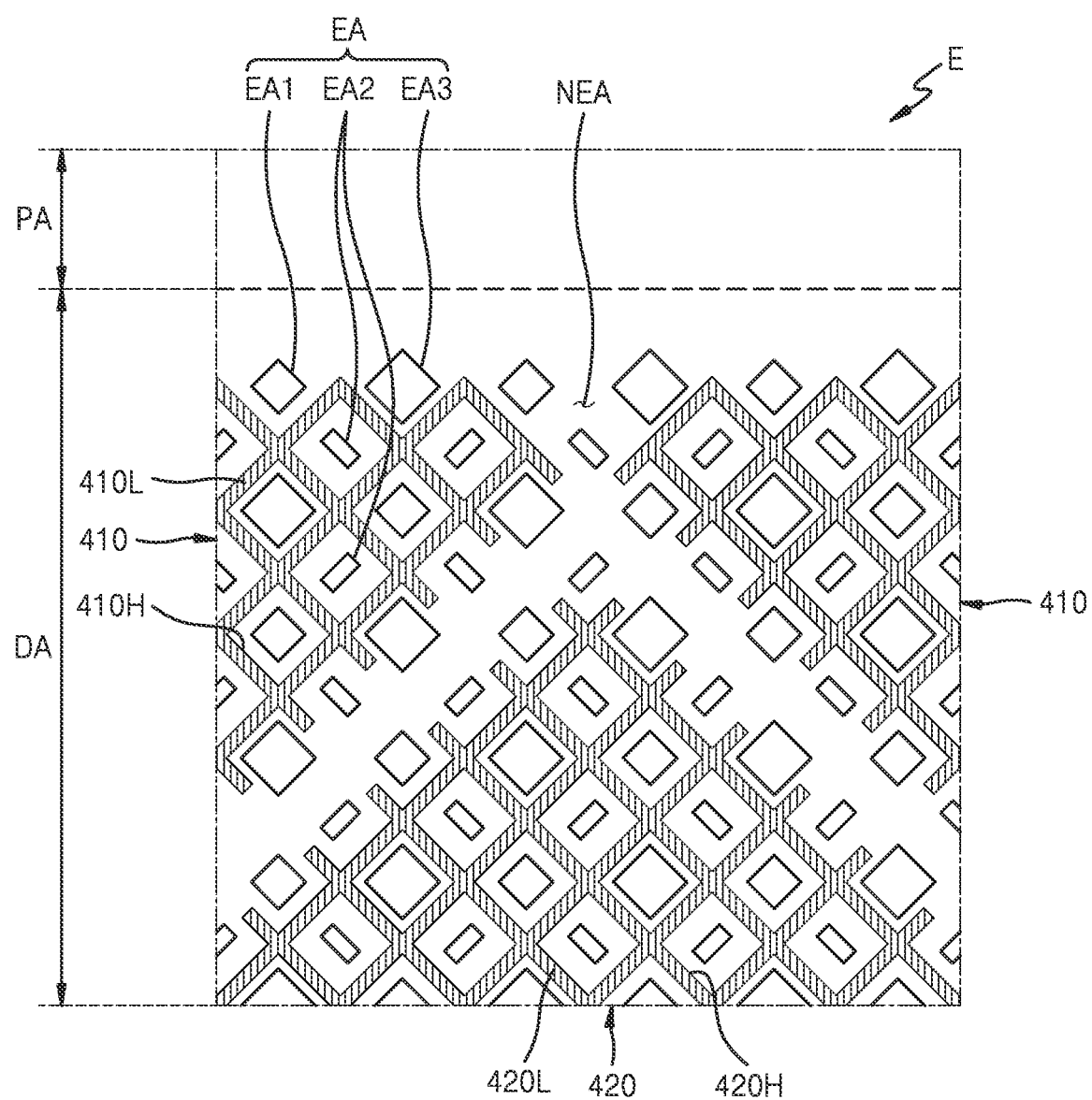

Each of the first sensing electrode 410 and the second sensing electrode 420 may have a substantially diamond shape. FIG. 16D is an enlarged plan view illustrating a region E of FIG. 16C.

As shown in FIG. 16D, the first sensing electrode 410 may include grid lines 410L having a grid structure including a plurality of holes 410H. Each hole 410H may overlap (e.g., be aligned with) the emission area EA of a corresponding pixel PX. Similarly, the second sensing electrode 420 may include grid lines 420L having a grid structure including a plurality of holes 420H. Each hole 420H may overlap (e.g., be aligned with) the emission area EA of a corresponding pixel PX. The emission areas EA may have various sizes. Sizes of the emission area EA1 of the first pixel, the emission area EA2 of the second pixel, and the emission area EA3 of the third pixel may be different from one another. For example, sizes of an emission area emitting red light, an emission area emitting green light, and an emission area emitting blue light may be different from one another. In FIG. 16D, sizes of the holes 410H and 420H are the same.

In another embodiment, sizes of the holes 410H and 420H overlapping the emission areas EA may vary according to sizes of the emission areas EA (e.g., the sizes of the holes correspond to the sizes of the emission areas EA of the corresponding pixels PX). The grid lines 410L of the first sensing electrodes 410 and the grid lines 420L of the second sensing electrodes 420 may be located in the non-emission area NEA surrounding the emission areas EA. Line widths of the grid lines 410L and 420L may be several micrometers. As shown in FIG. 16D, the display area DA may include the plurality of emission areas EA and the non-emission area NEA, and the peripheral area PA may include the non-emission area.

Figure 17:
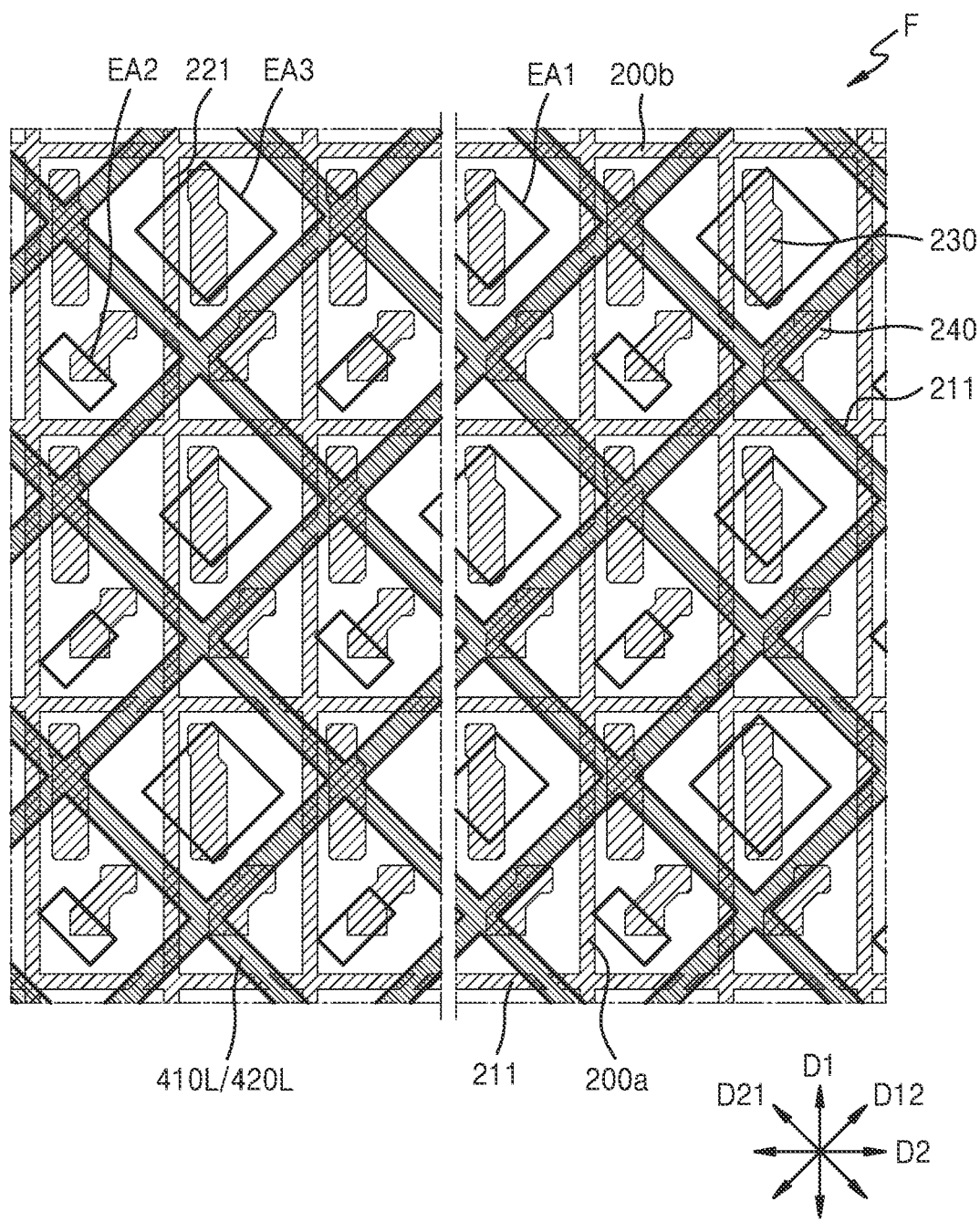
FIG. 17 is a plan view illustrating a sensing electrode and a first wiring according to an embodiment.
Figure 18:
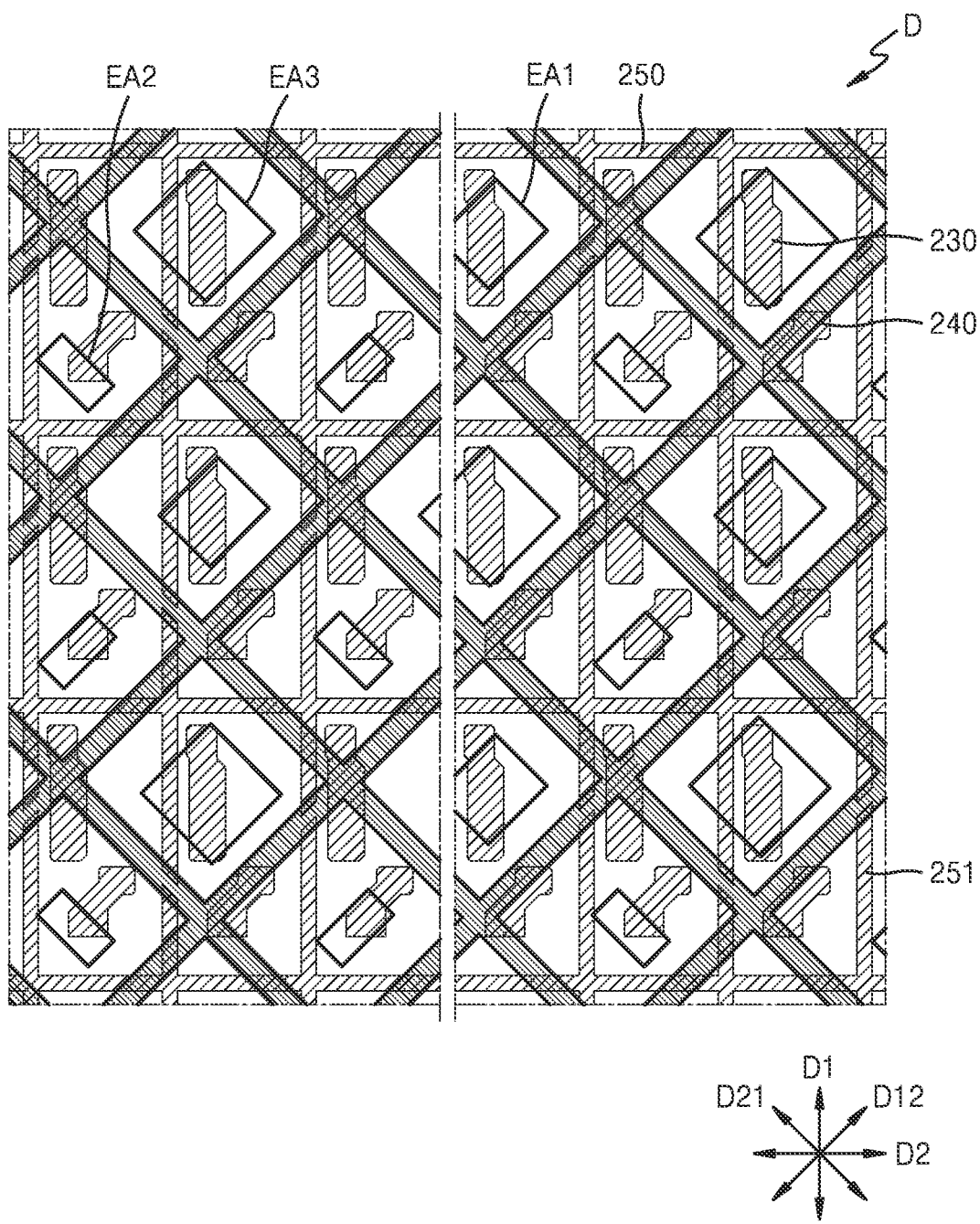
FIG. 18 is a plan view illustrating the sensing electrode and a fourth wiring according to an embodiment.
Figure 19A:
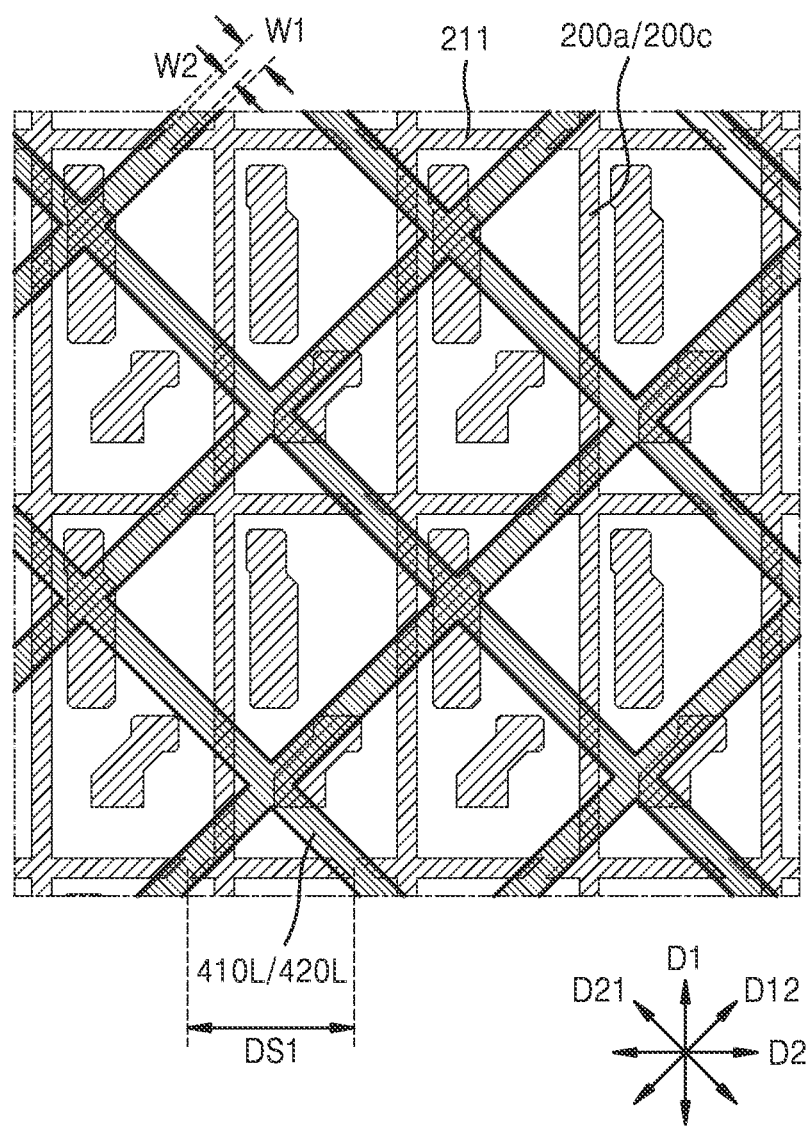
FIGS. 19A and 19B are partial enlarged plan views illustrating the sensing electrode and the first wiring.
Figure 19B:
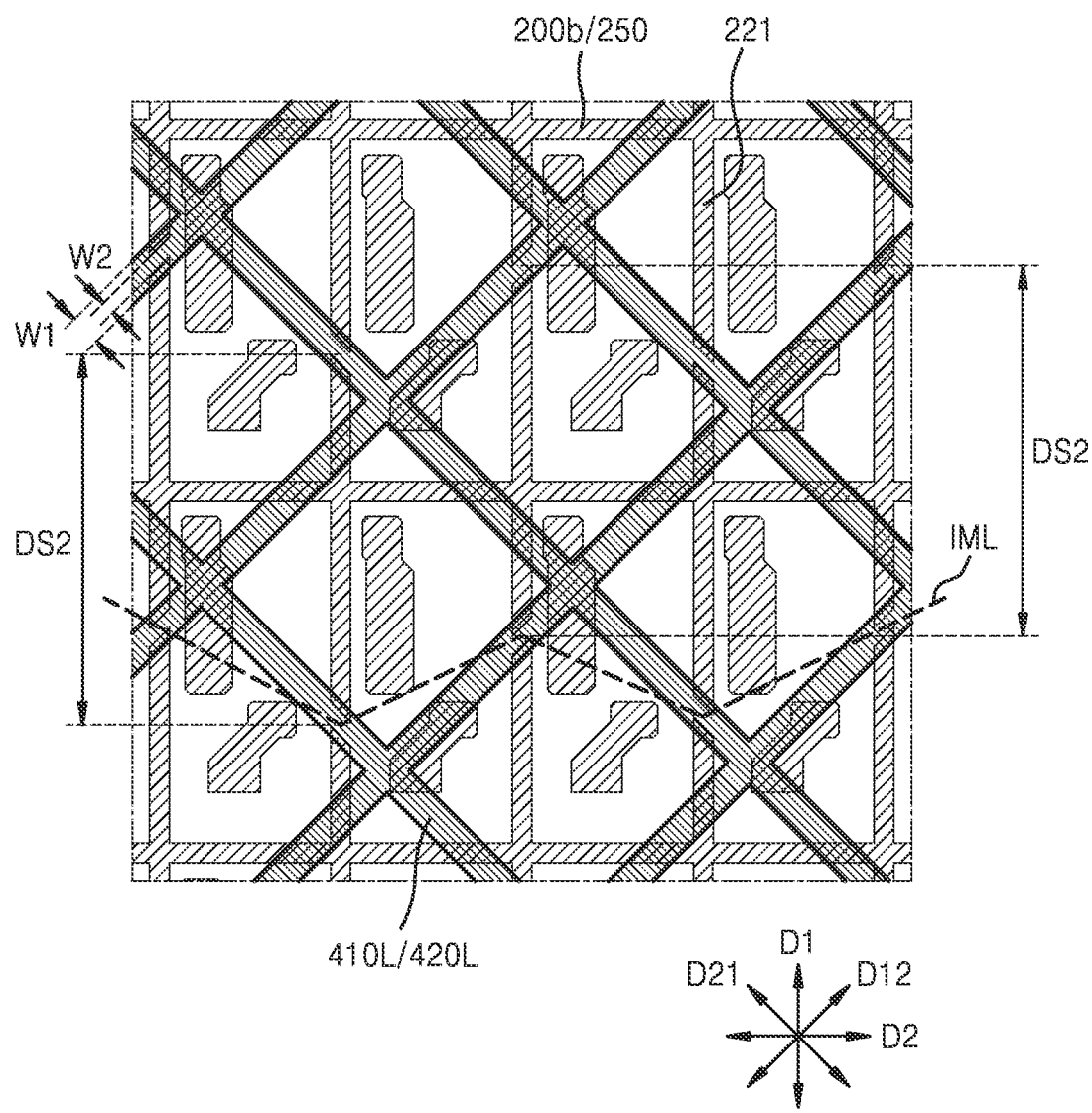
Figure 20:
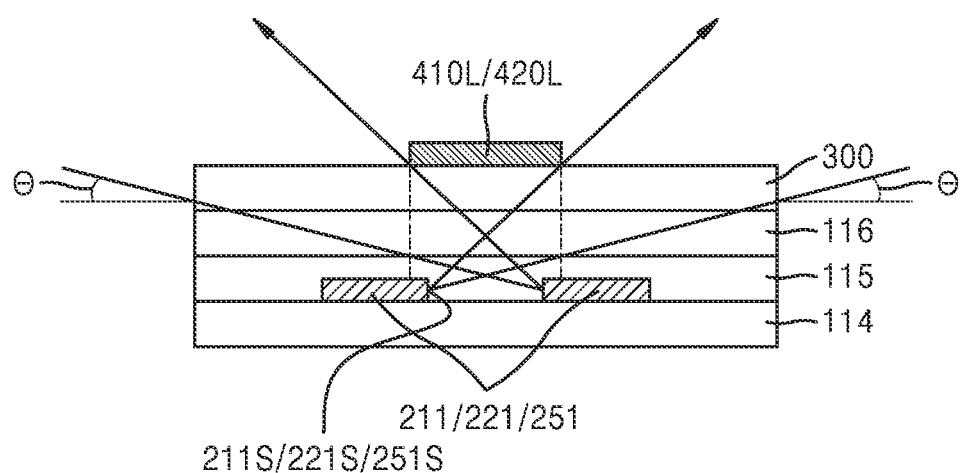
FIG. 20 is a cross-sectional view illustrating a stacked relationship of the sensing electrode and the first wiring or the fourth wiring according to an embodiment.

FIG. 17 is a plan view illustrating a sensing electrode and a first wiring according to an embodiment, and FIG. 18 is a plan view illustrating the sensing electrode and a fourth wiring according to an embodiment. FIGS. 19A and 19B are partial enlarged plan views illustrating the sensing electrode and the first wiring of FIG. 17. FIG. 20 is a cross-sectional view illustrating a stacked relationship of the sensing electrode and the first wiring or the fourth wiring according to an embodiment. FIG. 17 is a partial enlarged plan view of a portion F of FIG. 1, illustrating the sensing electrode and the first wiring, and FIG. 18 is a partial enlarged plan view of a region D of FIG. 1, illustrating the sensing electrode and the fourth wiring.

Referring to FIGS. 17, 19A, and 19B, the grid line 410L of the first sensing electrode 410 and the grid line 420L of the second sensing electrode 420 may include portions extending in the diagonal direction D12 and portions extending in the anti-diagonal direction D21, the anti-diagonal direction D21 crossing the diagonal direction D12. The grid line 410L of the first sensing electrode 410 and the grid line 420L of the second sensing electrode 420 may overlap a gap between the first branches 211 of the first wiring 200 and a gap between the second branches 221 of the first wiring 200. End portions of the first branches 211 and the second branches 221 may have an oblique shape inclined in a direction (e.g., a predetermined direction), and a direction in which the end portions of the first branches 211 and the second branches 221 are inclined may vary according to an extension direction of the grid lines 410L and 420L. End portions of the first branches 211 and the second branches 221 overlapping the grid lines 410L and 420L whose extension direction is the diagonal direction D12 may have an oblique shape inclined in the diagonal direction D12. End portions the first branches 211 and the second branches 221 overlapping the grid lines 410L and 420L whose extension direction is the anti-diagonal direction D21 may have an oblique shape inclined in the anti-diagonal direction D21. A width W1 of each of the grid lines 410L and 420L may be greater than a width W2 of a gap. The end portions may be inclined by about 45° from an extension direction of the first wiring 200, that is, the first direction D1 that is an extension direction of the first portion 200a and the third portion 200c of the first wiring 200 or the second direction D2 that is an extension direction of the second portion 200b of the first wiring 200.

Directions in which end portions of the first branches 211 protruding in both directions from the first portion 200a and the third portion 200c of the first wiring 200 are inclined may be different (or may be the same in some embodiments). For example, a direction in which end portions of the first branches 211 protruding rightward from the first portion 200a and the third portion 200c of the first wiring 200 are inclined may be the diagonal direction D12, and a direction in which end portions of the first branches 211 protruding leftward from the first portion 200a and the third portion 200c of the first wiring 200 are inclined may be the anti-diagonal direction D21. Lengths of the first branches 211 protruding rightward from the first portion 200a and the third portion 200c may be substantially the same and lengths of the first branches 211 protruding leftward from the first portion 200a and the third portion 200c may be substantially the same. Lengths of the first branches 211 protruding rightward from the first portion 200a and the third portion 200c and lengths of the first branches 211 protruding leftward from the first portion 200a and the third portion 200c may be different. Positions of gaps between the first branches 211 in the first direction D1 may be substantially the same, and gaps between the first branches 211 in the second direction D2 may be located at intervals (e.g., predetermined intervals DS1).

Directions in which end portions of the second branches 221 protruding in both directions from the second portion 200b of the first wiring 200 are inclined may be different. For example, directions in which end portions of the second branches 221 protruding upward and downward from the second portion 200b of the first wiring are inclined may be alternately the diagonal direction D12 and the anti-diagonal direction D21 in the second direction D2. Lengths of the second branches 221 protruding upward from the second portion 200b and lengths of the second branches 221 protruding downward from the second portion 200b may be different. Gaps between the second branches 221 in the second direction D2 may be formed in a zigzag pattern, and gaps between the second branches 221 in the first direction D1 may be located at intervals (e.g., predetermined intervals DS2).

As shown in FIG. 18, the grid line 410L of the first sensing electrode 410 and the grid line 420L of the second sensing electrode 420 may overlap a gap between the third branches 251 of the fourth wiring 250. End portions of the third branches 251 may have an oblique shape, and a direction in which the end portions of the third branches 251 are inclined may vary according to an extension direction of the grid lines 410L and 420L. End portions of the third branches 251 overlapping the grid lines 410L and 420L whose extension direction is the diagonal direction D12 may have an oblique shape inclined in the diagonal direction D12. End portions of the third branches 251 overlapping the grid lines 410L and 420L whose extension direction is the anti-diagonal direction D21 may have an oblique shape inclined in the anti-diagonal direction D21. A width of each of the grid lines 410L and 420L may be greater than a width of a gap. The end portions may be inclined by about 45° from the second direction D2 that is an extension direction of the fourth wiring 250.

As shown in FIG. 19B, directions in which end portions of the third branches 251 protruding in both directions from the fourth wiring 250 are inclined may be different. For example, directions in which end portions of the third branches 251 protruding upward and downward from the fourth wiring 250 are inclined may be alternately the diagonal direction D12 and the anti-diagonal direction D21 in the second direction D2. Lengths of the third branches 251 protruding upward from the fourth wiring 250 and lengths of the third branches 251 protruding downward from the fourth wiring 250 may be different. Gaps between the third branches 251 in the second direction D2 may be formed in a zigzag pattern along a virtual line IML, and gaps between the third branches 251 in the first direction D1 may be located at the intervals (e.g., predetermined intervals DS2).

As shown in FIG. 20, the grid line 410L of the first sensing electrode 410 and the grid line 420L of the second sensing electrode 420 may overlap a gap between end portions of facing first branches 211 of the first portion 200a and the third portion 200c of the first wiring 200, facing second branches 221 of the second portion 200b, and facing third branches 251 of the fourth wiring 250. The plurality of insulating layers 115 and 116 and the encapsulation layer 300 may be located between the grid lines 410L and 420L and the first wiring 200/the fourth wiring 250. The grid lines 410L and 420L may block light reflected by the end surfaces 211S, 221S, and 251S of the first through third branches 211, 221, and 251 of the first wiring 200 and the fourth wiring 250. When the grid lines 410L and 420L overlap a gap, the grid lines 410L and 420L minimize an angle Θ at which a user may observe light reflected by the end surfaces 211S, 221S, and 251S of the first through third branches 211, 221, and 251.

As shown in FIGS. 17 and 18, a first emission area EA1, a second emission area EA2, a third emission area EA3, and a second emission area EA2 are repeatedly formed in the second direction D2 in the display area DA. That is, a first pixel, a second pixel, a third pixel, and a second pixel (e.g., a red pixel, a green pixel, a blue pixel, and a green pixel) are repeatedly formed in the second direction D2 in the display area DA. As shown in FIGS. 19A and 19B, densities of end surfaces of branches seen in different directions in an area where four consecutive pixels are located may be the same.

Also, although directions in which end portions of the first through third branches 211, 221, and 251 are inclined are different in an embodiment, because inclination directions or positions of branches have periodicity in the first direction D1 and/or the second direction D2, the user looking at the display apparatus may not see a specific pattern in a specific area.

Figure 21:
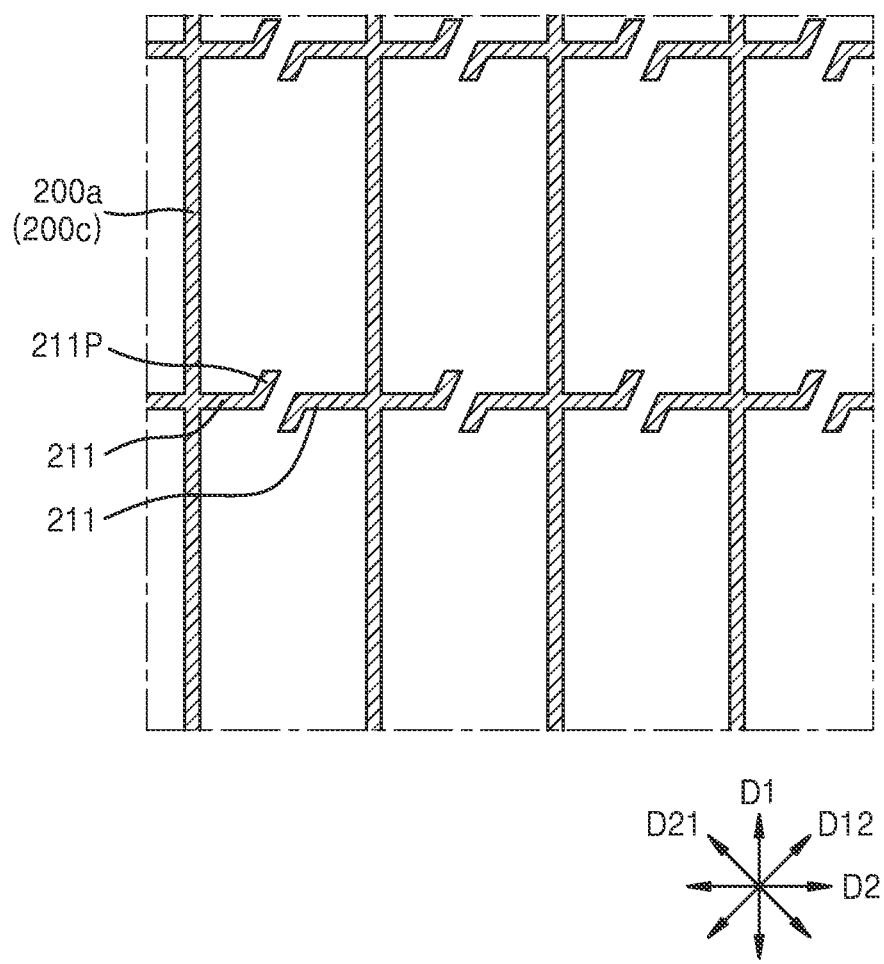
FIGS. 21, 22, and 23 are views illustrating a first wiring and a fourth wiring according to another embodiment.
Figure 22:
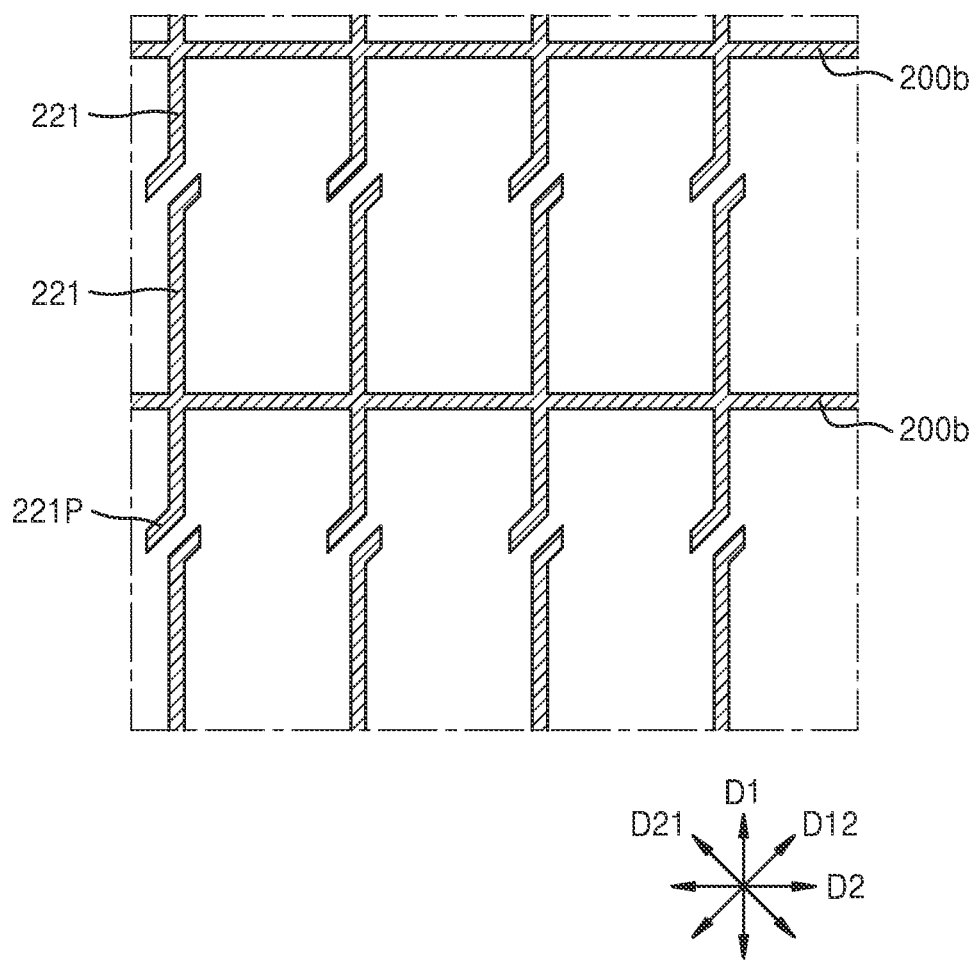
Figure 23:
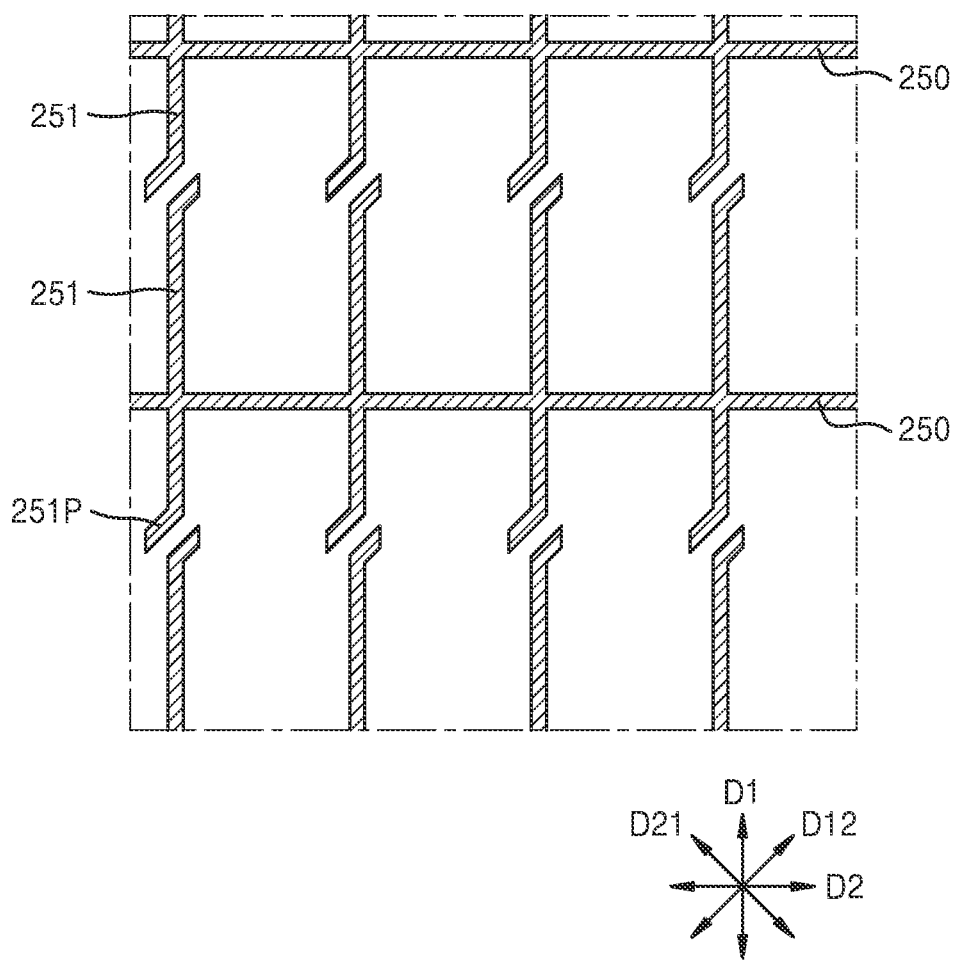

FIGS. 21, 22, and 23 are views illustrating a first wiring and a fourth wiring according to another embodiment.

As shown in FIG. 21, end portions 211P of the first branches 211 protruding in both directions from the first portion 200a and the third portion 200c of the first wiring 200 may protrude in an oblique direction of the diagonal direction D12 or the anti-diagonal direction D21. Directions in which the end portions 211P of the first branches 211 facing each other in the same line protrude may be opposite. End surfaces of the end portions 211P of the first branches 211 facing each other in the same line may face each other.

As shown in FIG. 22, end portions 221P of the second branches 221 protruding in both directions from the second portion 200b of the first wiring 200 may protrude in an oblique direction of the diagonal direction D12 or the anti-diagonal direction D21. Directions in which the end portions 221P of the second branches 221 facing each other in the same line may be opposite. End surfaces of the end portions 221P of the second branches 221 facing each other in the same line may face each other.

As shown in FIG. 23, end portions 251P of the third branches 251 protruding in both directions from the fourth wiring 250 may protrude in an oblique direction of the diagonal direction D12 or the anti-diagonal direction D21. Directions in which the end portions 251P of the third branches 251 facing each other in the same line may be opposite. End surfaces of the end portions 251P of the third branches 251 facing each other in the same line may face each other.

According to embodiments of the present disclosure, because end portions of the first and second branches 211 and 221 of the first wiring 200 located in the first area S1 and the third branches 251 of the fourth wiring 250 located in the second area S2 are obliquely formed, reflection characteristics of light are similar to each other and densities of end surfaces that are seen are the same regardless of directions in which the user sees or views a display apparatus, thereby preventing or substantially preventing areas from being distinguishably seen (e.g., preventing or substantially preventing different areas from appearing different).

According to embodiments of the present disclosure, because connection wirings for transferring a data signal to a data line are located in a display area, a dead area of a display apparatus may be reduced. Also, because reflection characteristics are the same or similar over the display area, areas where the connection wirings are located may be prevented from being distinguishably seen. However, the scope of the present disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
a first data line extended in a first direction in a display area;
a second data line extended in the first direction in the display area;
a first wiring in the display area and connected to the first data line; and
a second wiring in the display area and connected to the second data line,
wherein the first wiring and the second wiring are connected to a driving circuit located in a peripheral area outside the display area,
wherein each of the first wiring and the second wiring comprises a first portion extending in the first direction or in a second direction perpendicular to the first direction and a second portion protruding from the first portion, and
wherein an end portion of the second portion of the first wiring and an end portion of the second portion of the second wiring are separated from each other and face each other.

2. The display apparatus of claim 1, wherein the first portion of each of the first wiring and the second wiring comprises a first extension portion and a third extension portion extending in the first direction and a second extension portion extending in the second direction, the second extension portion being located between the first extension portion and the third extension portion.

3. The display apparatus of claim 1, wherein the end portions of the second portions of the first wiring and the second wiring are inclined in a same direction.

4. The display apparatus of claim 1, wherein the first wiring and the first data line are located at different layers.

5. The display apparatus of claim 1, further comprising a plurality of sensing electrodes located on the first wiring and the second wiring.

6. The display apparatus of claim 5, wherein each of the plurality of sensing electrodes comprises a grid line, and wherein the grid line overlaps a gap between end portions of the second portions of the first wiring and the second wiring.

7. The display apparatus of claim 6, wherein a width of the grid line is greater than a width of the gap.

8. The display apparatus of claim 6, wherein an extension direction of the grid line and an inclined direction of the end portions of the second portions of the first wiring and the second wiring are the same.

9. The display apparatus of claim 1, further comprising a connection line located in the peripheral area and connecting the first wiring to the driving circuit.

10. The display apparatus of claim 1, further comprising a display element located in the display area and comprising a first electrode, a second electrode and an emission layer between the first electrode and the second electrode.

11. The display apparatus of claim 10, wherein the first wiring is at a layer between the first data line and the first electrode of the display element.

12. The display apparatus of claim 10, wherein a pair of second portions are protruded from the first wiring and the pair of second portions are in a same line.

\* \* \* \* \*